(12) United States Patent
Westby et al.

(10) Patent No.: US 8,914,697 B2
(45) Date of Patent: Dec. 16, 2014

(54) DATA CORRUPTION DETECTION

(75) Inventors: Judy L. Westby, Savage, MN (US);
Rodney D. Blake, Savage, MN (US)

(73) Assignee: Seagate Technology LLC, Cupertino, CA (US)

( * ) Notice: Subject to any disclaimer, the term of this patent is extended or adjusted under 35 U.S.C. 154(b) by 1383 days.

(21) Appl. No.: 12/548,346

(22) Filed: Aug. 26, 2009

(65) Prior Publication Data
US 2011/0055641 A1 Mar. 3, 2011

(51) Int. Cl.
*H03M 13/00* (2006.01)
*G06F 11/10* (2006.01)
*H03M 13/29* (2006.01)
*H03M 13/09* (2006.01)
*H03M 13/15* (2006.01)
*H03M 13/19* (2006.01)

(52) U.S. Cl.
CPC ....... *G06F 11/1012* (2013.01); *H03M 13/1515* (2013.01); *H03M 13/2906* (2013.01); *H03M 13/19* (2013.01); *H03M 13/15* (2013.01); *H03M 13/09* (2013.01); *H03M 13/2909* (2013.01)
USPC .......................................................... 714/758

(58) Field of Classification Search
CPC .. H03M 13/09; H03M 13/091; H04L 1/0061; H04L 1/0057; H04L 1/0045
USPC .......................................................... 714/758
See application file for complete search history.

(56) References Cited

U.S. PATENT DOCUMENTS

| | | | |
|---|---|---|---|
| 4,398,292 A | 8/1983 | Doi et al. | |
| 5,781,561 A * | 7/1998 | Machida et al. | 714/752 |
| 6,219,791 B1 | 4/2001 | Blanchard et al. | |
| 7,480,847 B2 * | 1/2009 | Schulz | 714/774 |
| 7,945,812 B1 * | 5/2011 | Perozo | 714/13 |
| 8,132,073 B1 * | 3/2012 | Bowers et al. | 714/755 |
| 8,375,272 B2 * | 2/2013 | Litsyn et al. | 714/758 |
| 8,418,031 B1 * | 4/2013 | Yang et al. | 714/774 |
| 2004/0139380 A1 * | 7/2004 | Sako | 714/758 |
| 2007/0061679 A1 * | 3/2007 | Kikuchi et al. | 714/758 |
| 2009/0044077 A1 | 2/2009 | Choi et al. | |
| 2010/0266120 A1 * | 10/2010 | Leggette et al. | 380/28 |
| 2011/0093761 A1 * | 4/2011 | Eldredge et al. | 714/758 |

* cited by examiner

*Primary Examiner* — Albert Decady
*Assistant Examiner* — Enam Ahmed
(74) *Attorney, Agent, or Firm* — Hollingsworth Davis, LLC

(57) ABSTRACT

In general, this disclosure relates to various techniques for detecting corrupt bits in a data stream. The techniques may allow a data storage device to detect corrupt bits prior to transformation of the data stream and subsequent to transformation of the data stream. A data storage device may include a first error-related code generating unit configured to generate a first error-related code based on received data and combine the first error-related code and the received data to generate a first data stream. The data storage device may further include a transform unit configured to transform the first data stream to a transformed data stream. The data storage device may also include a second error-related code generating unit configured to generate a second error-related code based on the transformed data stream.

18 Claims, 13 Drawing Sheets

DATA CORRUPTION DETECTION

BACKGROUND

As data is transferred through a device or system, the data bits within the data may become altered or corrupted due to imperfections in the data paths of the device or system. To aid in detecting and/or correcting the corrupted data bits, an error detection code (EDC) or error correction code (ECC) may be combined with the data. The EDC or ECC is generated based on the content of the data. To detect corrupt bits, an error checking unit generates another EDC or ECC based on the content of the data and compares the newly generated EDC or ECC with the EDC or ECC that is combined with the data. If the comparison results in a match between the EDCs or ECCs, none of the data bits were corrupted. On the other hand, if the comparison does not result in a match between the EDCs or ECCs, at least one of the data bit was corrupted. In some examples, a data path of the device or system may include a transform unit that transforms the combined EDC or ECC and the data bits.

SUMMARY

In general, this disclosure describes various techniques for detecting corrupt bits in a data stream. The data stream may be a transformed version of a combination of a first error-related code and data bits received from a host interface unit. In accordance with this disclosure, an error-related code generating unit may generate a second error-related code based on the data stream. The second error-related code may be used to detect and, in some examples, correct corrupt bits in the data stream. The error-related code may be an error detection code (EDC) or an error correction code (ECC).

In one aspect, the disclosure is directed to a method comprising generating, in a data storage device, a first error-related code based on received data, combining, in the data storage device, the first error-related code with the received data to generate a data stream, transforming, in the data storage device, the data stream into a transformed data stream, and generating, in the data storage device, a second error-related code based on the transformed data stream.

In another aspect, the disclosure is directed to a method comprising retrieving, in a data storage device, a first data stream from a media storage unit, wherein the first data stream includes a transformed stream, and wherein the transformed stream includes a commingled first error-related code and data that have been transformed, generating a second error-related code based on the retrieved data stream, combining the second error-related code with the retrieved data stream to generate a second data stream, processing the second data stream in at least one data path to create a processed second data stream, removing the second error-related code from the processed second data stream to generate a processed transformed stream, and inverse transforming the processed transformed stream to generate an inverse transformed stream.

In another aspect, the disclosure is directed to a data storage device comprising at least one processor, a first error-related code generating unit configured in the at least one processor to generate a first error-related code based on received data and combine the first error-related code and the received data to generate a first data stream, a transform unit configured in the at least one processor to transform the first data stream to a transformed data stream, and a second error-related code generating unit configured in the at least one processor to generate a second error-related code based on the transformed data stream.

In another aspect, the disclosure is directed to a computer-readable storage medium comprising instructions. The instructions cause one or more processors to generate a first error-related code based on received data, combine the first error-related code with the received data to generate a data stream, transform the data stream into a transformed data stream, and generate a second error-related code based on the transformed data stream.

The details of one or more aspects of the disclosure are set forth in the accompanying drawings and the description below. Other features, objects, and advantages of the disclosure will be apparent from the description and drawings, and from the claims.

DETAILED DESCRIPTION

Figure 1:
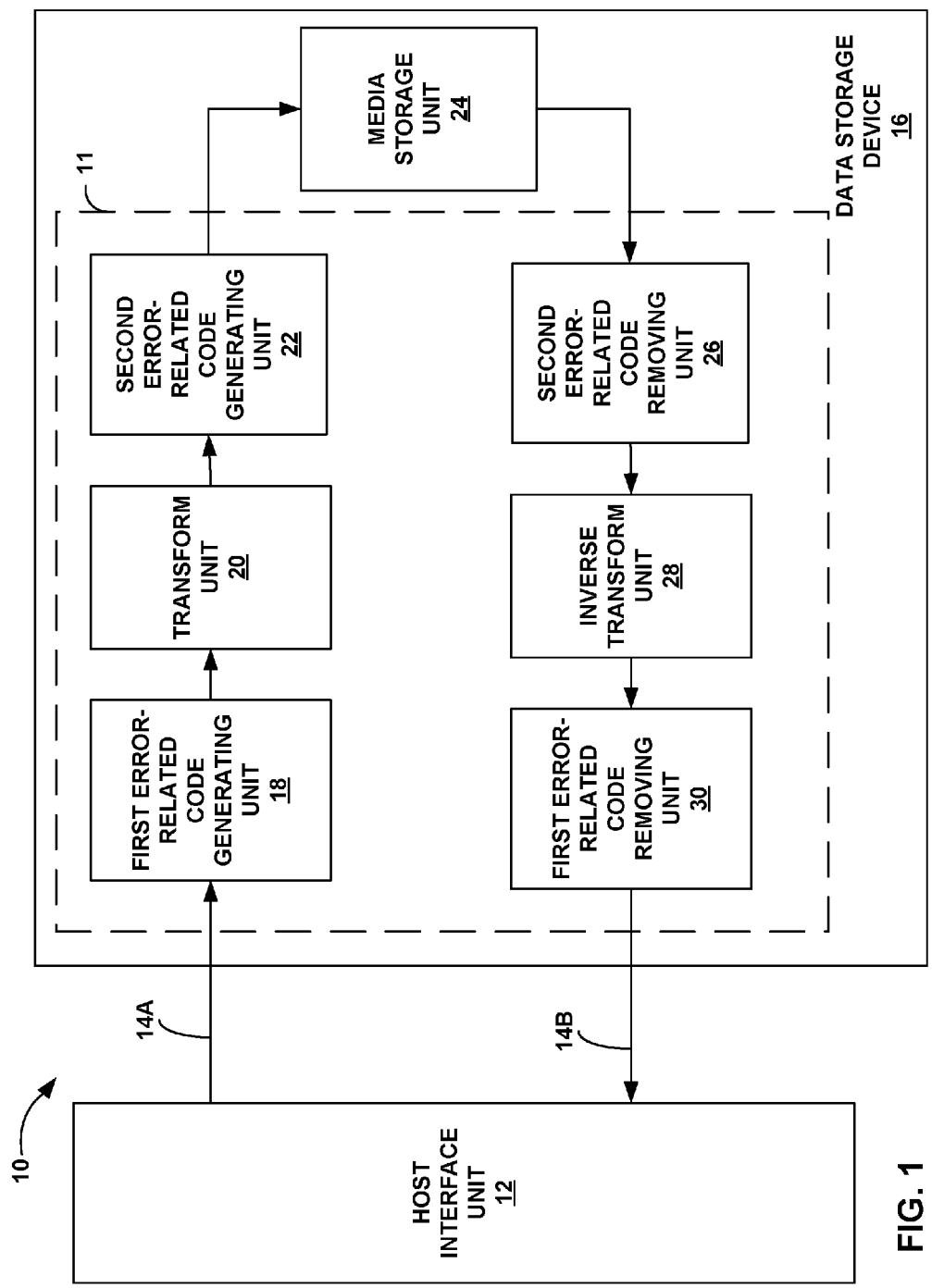
FIG. 1 is a block diagram illustrating an example storage system including a host interface unit and a data storage device.

FIG. 1 is a block diagram illustrating storage system 10 including host interface unit 12 and data storage device 16. In some examples, host interface unit 12 may be a computing device such as a personal computer or workstation computer that includes an appropriate communication card to interface with data storage device 16. In some examples, host interface unit 12 may be a mainframe computer that includes an appropriate host controller that interfaces with data storage device 16. Host interface unit 12 is coupled to data storage device 16 via bus lines 14A and 14B that may be a part of a common bus 14. Bus 14 may be a serial advanced technology attachment (SATA), small computer system interface (SCSI), serial attached SCSI (SAS), Fibre channel, Ethernet, FireWire, Peripheral Component Interconnect Express (PCI-Express), or universal serial bus (USB). In some examples, though not shown in FIG. 1, host interface unit 12 may couple to multiple data storage devices where each multiple data storage device is substantially similar to data storage device 16. In these examples, bus 14 may be parallel advanced technology attachment (PATA) or an integrated drive electronics (IDE) interface.

Examples of data storage device 16 may include a hard drive, an optical drive, an external disk enclosure device, a solid-state storage device, and the like. Data storage device 16 includes first error-related code generating unit 18, transform unit 20, second error-related code generating unit 22, media storage unit 24, second error-related code removing unit 26, inverse transform unit 28, and first error-related code removing unit 30. Data storage device 16 shown in FIG.1 is provided for illustration purposes only. Data storage device 16 may include additional units and/or modules not shown in FIG. 1 for purposes of clarification. In some examples, the first error-related code generating unit 18, the transform unit 20, the second error-related code generating unit 22, the second error-related code removing unit 26, the inverse transform unit 28, and the first error-related code removing unit 30 may be formed in one or more integrated circuits (ICs) such as at least one processor 11. The ICs may include, for example, one or more microprocessors, digital signal processors (DSPs), field-programmable gate arrays (FPGAs), application-specific integrated circuits (ASICs), application-specific standard products (ASSPs), or any combinations thereof.

Host interface unit 12 writes data in form of digital data bits to data storage unit 16. The data may be organized into sectors which are fixed sized entities of digital data bits. Each data sector may range in size from approximately 512 bytes up to and including 4096bytes but other data sector sizes are contemplated by this disclosure.

First error-related code generating unit 18 may receive write data and generate a first error-related code based on the received write data. First error-related code generating unit 18 may combine the first error-related code and the write data to generate a write data stream which may be considered as a first data stream. As one non-limiting example, first error-relate code generating unit 18 may append the first error-related code to the write data. The first error-related code may be an EDC or ECC. First error-related code generating unit 18 may utilize an appropriate deterministic algorithm to generate the EDC or ECC. EDC and ECC are described in more detail with respect to FIG. 3. In one non-limiting example, the first error-related code may be 2 bytes in length, though other possible lengths are contemplated in this disclosure. The length of the first error-related code may be a function of the algorithm used by the first error-related code generating unit 18 to generate the first error-related code.

Transform unit 20 receives the write data stream and transforms the write data stream. Transform unit 20 may be a data encryption unit or a data compressor unit but should not considered limited to a data encryption unit or a data compressor unit. During transformation via transform unit 20, the write data and the first error-related code may become commingled. Subsequent to transformation, it may be difficult to delineate between the first error-related code and the write data. For example, transform unit 20 may encrypt the write data stream. Subsequent to the encryption, it may be difficult to ascertain which bits within the encrypted bits represent the write data and which bits represent the first error-related code. Transform unit 20 transmits the transformed write data stream to the second error-related code generating unit 22.

Second error-related code generating unit 22 may generate a second error-related code based on the transformed write data stream. In accordance with this disclosure, the second error-related code is based on the commingled first-error related code and write data that have been transformed. Second error-related code generating unit 22 may combine the second error-related code and the transformed write data stream to generate a second data stream. As one non-limiting example, second error-relate code generating unit 22 may append the second error-related code to the write data stream. The second error-related code may be an EDC or ECC. Second error-related code generating unit 22 may utilize an appropriate deterministic algorithm to generate the EDC or ECC. In one non-limiting example, the second error-related code may be 2 bytes in length, though other possible lengths are contemplated in this disclosure.

In some examples, the algorithm used by first error-related code generating unit 18 to generate the first error-related code may be different than the algorithm used by second error-related code generating unit 22 to generate the second error-related code. In some examples, first error-related code generating unit 18 may generate an EDC, and second error-related code generating unit 22 may generate an ECC, or vice-versa. Furthermore, in some examples, the length of the first error-related code may be different than the length of the second error-related code.

Media storage unit 24 receives the second data stream from second error-related code generating unit 22, i.e., the second error-related code combined with the write data stream, where the write data stream includes commingled bits of the first error-related code and write data that have been transformed. Media storage unit 24 stores the second data stream. One example of media storage unit 24 is a rotating storage media of a hard drive. Other examples include FLASH memory, random access memory (RAM), synchronous dynamic random access memory (SDRAM), non-volatile random access memory (NVRAM), electrically erasable programmable read-only memory (EEPROM), dynamic random access memory (DRAM), and static random access memory (SRAM).

In some examples, media storage unit 24 may be a computer-readable storage medium. In these examples, media storage unit 24, in addition to storing a data stream, may include instructions that cause one or more processors, such as the at least one processor 11, to perform various functions. For example, media storage unit 24 may include instructions that cause the at least one processor 11 that forms the first error-related code generating unit 18, the transform unit 20, the second error-related code generating unit 22, the second error-related code removing unit 26, the inverse transform unit 28, and the first error-related code removing unit 30 to perform the functions attributed to those units.

In accordance with some aspects of this disclosure, host interface unit 12 writes data to media storage unit 24 in the manner described above. The manner in which host interface unit 12 writes data to media storage unit 24 may provide many benefits. The first and second error-related codes may allow data storage device 16 to determine whether any of the write data has been corrupted or otherwise altered. For example, after the first error-related code is generated and combined with the write data but before transformation, various units within data storage device 16, shown in more detail in FIG. 3, may use the first error-related code to determine whether any part of the write data has been corrupted. In this manner, any write data path where the write data becomes corrupted may be isolated and in some examples, the corrupted bits may be corrected.

However, after the write data stream is transformed, as described above, it may be difficult to delineate the first error-related code and the write data. Accordingly, it may be difficult to utilize the first error-related code to determine whether there is corruption in the write data stream. In accordance with this disclosure, the second error-related code may allow various units shown in FIG. 3 to determine whether any part of the transformed data has been corrupted. The second error-related code may allow isolation of the any data path where the data becomes corrupted and in some examples, the corrupted bits may be corrected.

In some conventional data storage devices, the data storage device generates an error-related code only after the write data is transformed. However, such conventional data storage devices may not be capable of determining whether the data was corrupted prior to transformation. For example, prior to transformation, in conventional data storage devices, the data may become corrupted. Subsequently, the corrupted data is transformed in the data storage device. In this example, in a conventional data storage device, the corrupted data may not be detected. In accordance with aspects of this disclosure, any corruption in the data prior to transformation may be detected via the first error-related code, and any corruption in the data subsequent to transformation may be detected via the second error-related code. Accordingly, aspects of this disclosure provide for more robust error detection techniques compared to conventional error detection techniques in data storage devices.

To read data from media storage unit 24, media storage unit 24 transmits the second data stream to second error-related code removing unit 26. Again, the second data stream stored in media storage unit 24 includes the second error-related code and the commingled first error-related code and read data that have been transformed during the writing process. Second error-related code removing unit 26 may remove the second error-related code. For example, the second error-relate code may be appended to the commingled first error-related code and read data that have been transformed. Second error-related code removing unit 26 may remove the appended second error-related code.

Inverse transform unit 28 receives the commingled first error-related code and read data that have been transformed. Again, second error-related code removing unit 26 removed the second error-related code. Inverse transform unit 28 inverse transforms the received data. Examples of inverse transform unit 28 include a data decryption unit or a data de-compressor unit. After inverse transformation, the first error-related code and the read data may be delineated but may remain combined as a data stream. In other words, it may be possible to differentiate between the first error-related code and the data that is to be read by host interface unit 12 in the combined data stream.

First error-related code removing unit 30 receives the first error-related code and the read data. First error-related code removing unit 30 may remove the first error-related code. For example, first error-related code removing unit 30 may remove the appended first error-relate code. Host interface unit 12 may then receive the read data from first error-related removing unit 30 via bus 14. In this manner, host interface unit 12 reads data from media storage unit 24.

Figure 2:
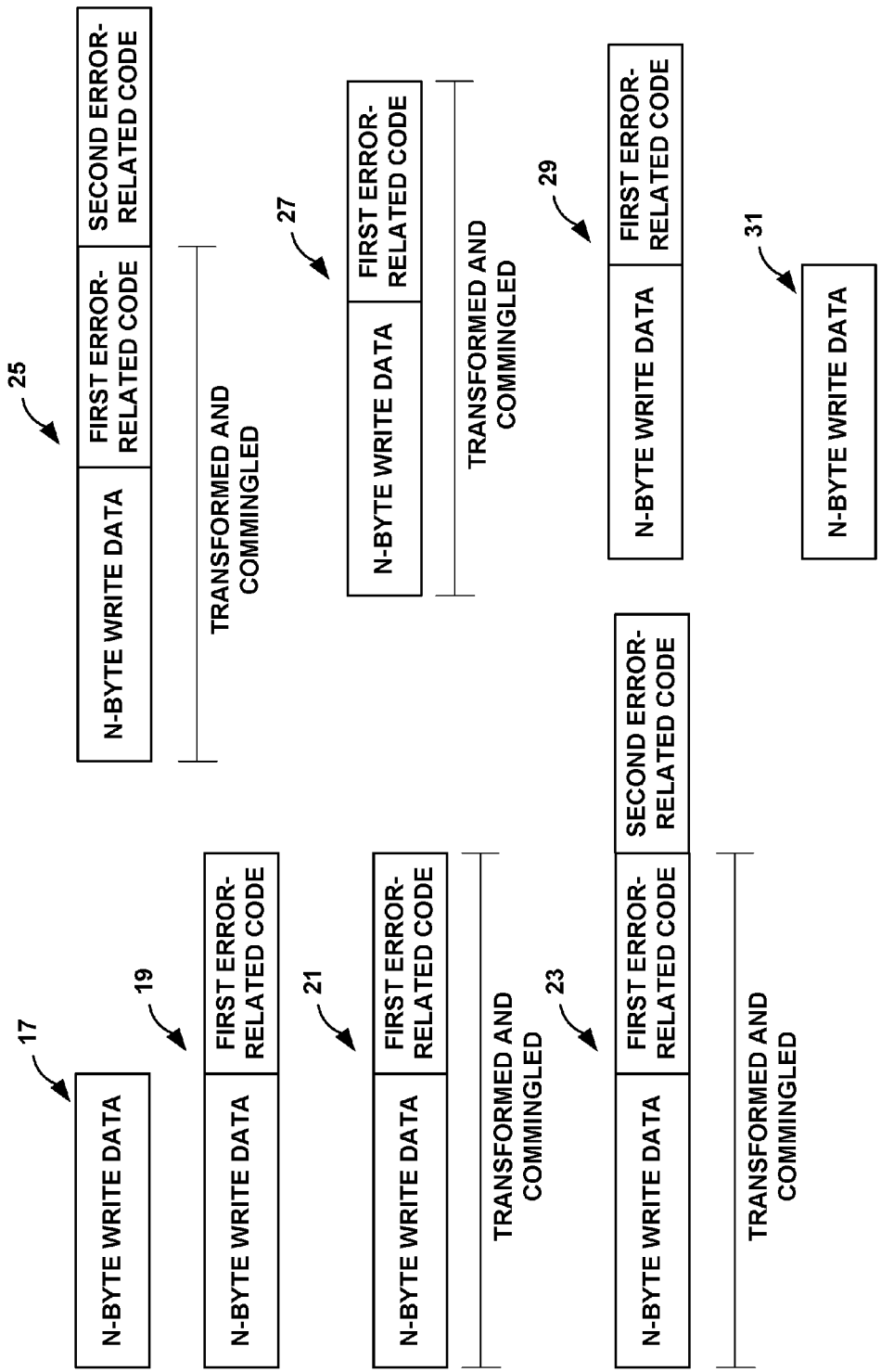
FIG. 2 is an illustration of various data streams through the data storage device shown in FIG. 1.

FIG. 2 is an illustration of various data streams through the data storage device shown in FIG. 1. Data stream 17 may be the write data provided by host interface unit 12 to first error-related code generating unit 18. Data stream 17 may include N bytes. In some examples, N may be greater than or equal to 512 and less than or equal to 4096. Data stream 19 may be the output of first error-related code generating unit 18. First error-related code generating unit 18 may generate a first error-related code based on data stream 17. First error-related code generating unit 18 may combine the first error-related code with data stream 17 to generate data stream 19. In some non-limiting examples, first error-related code generat-ing unit 18 may append the first error-related code to data stream 17 to generate data stream 19.

Data stream 21 may be the output of transform unit 20. Transform unit 20 may transform data stream 19 to generate data stream 21. After transformation, the first error-related code and data stream 17 may be become commingled. It may be difficult to delineate between the first error-related coded and data stream 17 in data stream 21.

Data stream 23 may be the output of second error-related code generating unit 22. Second error-related code generating unit 22 may generate a second error-related code based on data stream 21. Second error-related code generating unit 22 may combine the second error-related code with data stream 21 to generate data stream 23. In some non-limiting examples, second error-related code generating unit 22 may append the second error-related code to data stream 21 to generate data stream 23. Media storage unit 24 may store data stream 23.

Data stream 25 may be the data stream retrieved from media storage unit 24. Data stream 25 may be substantially similar to data stream 23. Data stream 25 includes a commingled, transformed version of the first error-related code and data that host interface unit 12 desires to read and the second error-related code.

Second error-related code removing unit 26 may receive data stream 25 and output data stream 27. Second error-related code removing unit 26 may remove the second error-related code to generate data stream 27. Data stream 27 may include commingled, transformed version of the first error-related code and data. Inverse transform unit 28 may receive data stream 27 and generate data stream 29. Data stream 29 may include the first error-related code and data that host interface unit 12 desires to read. Notably, in data stream 29, the first error-related code and data are combined; however, it may be possible to delineate between the first error-related code and the data in data stream 29.

First error-related code removing unit 30 may receive data stream 29 and generate data stream 31. First error-related code removing unit 30 may remove the first error-related code from data stream 29 to generate data stream 31. Data stream 31 may include only the data that host interface unit 12 desires to read. First error-related code removing unit 30 may transmit data stream 31 to host interface unit 12.

Figure 3:
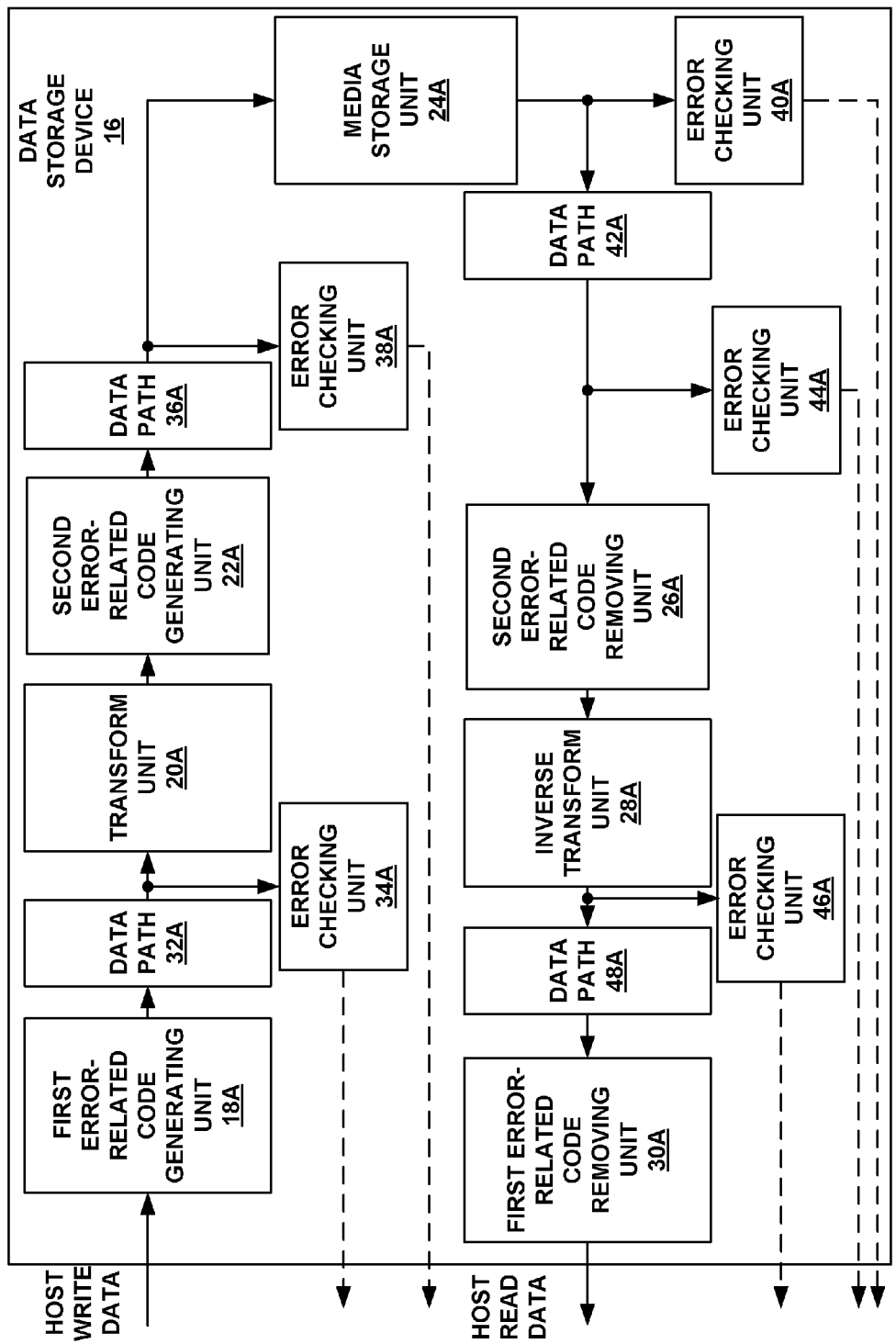
FIG. 3 is a block diagram illustrating details of one example of the data storage device shown in FIG. 1.

FIG. 3 is a block diagram illustrating details of one example data storage device 16 of FIG. 1. First error-related code generating unit 18A shown in FIG. 3 may be one example of first error-related code generating unit 18 shown in FIG. 1. As described above with respect to FIG. 1, first error-related code generating unit 18A receives write data from host interface unit 12. First error-related code generating unit 18A generates a first error-related code based on the write data and combines the write data and the first error-related code. In some examples, the first error-related code may be an EDC or ECC.

Examples of EDC include a parity bit, checksum, cyclic redundancy checks (CRC) codes, and hash function outputs. These error detection codes are provided for illustration purposes only and should be not be considered limiting. In aspects of this disclosure, first error-related code generating unit 18 may utilize other error detection codes such as proprietary error detection codes.

In examples where the first error-related code is a parity bit, first error-related code generating unit 18A may utilize an algorithm that counts the number of digital ones, e.g., logic highs, in the write data. If the number of digital ones is even, first error-related code generating unit 18A may set the parity bit to a digital one and combine the parity bit with the write data. If the number of digital ones is odd, first error-related code generating unit 18A may set the parity bit to a digital zero and combine the parity bit with the write data. In some examples, first error-related code generating unit 18A may set the parity bit to a digital one if the number of digital ones in the write data is odd, and set the parity bit to a digital zero if the number of digital ones in the write data is even. Alternatively, first error-related code generating unit 18A may count the number of digital zeros, e.g., digital lows, in the write data. If the number of digital zeros is even, first error-related code generating unit 18A may set the parity bit to a digital one and combine the parity bit with the write data. If the number of digital zeros is odd, first error-related code generating unit 18A may set the parity bit to a digital zero and combine the parity bit with the write data. In some examples, first error-related code generating unit 18A may set the parity bit to a digital one if the number of digital zeros in the write data is odd, and set the parity bit to a digital zero if the number of digital zeros in the write data is even. In these examples, the length of the first error-related code is one bit.

In examples where the first error-related code is a checksum, first error-related code generating unit 18A may utilize an algorithm that sums the value of the bits of the write data. First error-related code generating unit 18A may convert the summed value to binary bits as a checksum value. In these examples, the checksum may be considered the first error-related code. First error-related code generating unit 18A may then combine the checksum value with the write data. In these examples, the length of the first error-related code is a function of the summed value.

In examples where the first error-related code is a CRC, first error-related code generating unit 18A may utilize an algorithm that considers the write data as coefficients to a polynomial. The algorithm may then divide the polynomial by another predetermined polynomial. The coefficients of the division result may be the first error-related code. First error-related code generating unit 18A may then combine the first error-related code with the write data. The length of the first error-related code is a function of the number of exponents in the polynomial. Typical lengths of CRCs include 1 byte to 4 bytes, and may generally be 2 bytes in length.

In examples where the first error-related code is a hash function, first error-related code generating unit 18A may include a preprogrammed mathematical algorithm. The mathematical algorithm receives the write data bits as one input processes the write data bits to generate a unique value. In other words, the mathematical algorithm generates unique values for any possible write data. First error-related code generating unit 18A may convert the value from the mathematical algorithm into binary bits. The binary bits may be considered as the first error-related code. The length of the first error-related code is a function of the mathematical algorithm and may be generally 2 bytes in length.

Examples of ECC include forward error correction (FEC) codes, Reed-Solomon codes, Hamming code, and optimal rectangular codes. These error correction codes are provided for illustration purposes only and should be not be considered limiting. In aspects of this disclosure, first error-related code generating unit 18A may utilize other error correction codes such as proprietary error correction codes.

In examples where the first error-related code is a forward error correction (FEC) code, first error-related code generating unit 18A adds redundant data to the write data. The redundant data may be referred to as the first error-related code. FEC codes may allow a receiver to detect and correct errors without the need for host interface unit 12 to retransmit the write data. As one non-limiting example and as explained in more detail below, a processor or a hardware unit coupled to error checking unit 34A may be considered as the receiver that detects and correct errors. The processor or hardware unit may be able to correct errors within some bound, i.e., if there are far too many errors, the processor or hardware unit may not be capable of correcting the errors even if the first error-related code is a FEC code. FEC codes may allow for error correction without the need for a back-channel, i.e., without the need to transmit a signal back to host interface unit 12. However, combining an FEC code with the write data may require higher bandwidth requirements to transmit the data.

In examples where the first error-related code is a Reed-Solomon code, first error-related code generating unit 18A may utilize an algorithm that oversamples a polynomial constructed from the write data. The polynomial is evaluated at several points, and these values, i.e., values at the several points, may be considered the first error-related code and may be combined with the write data. Sampling the polynomial more often than is necessary makes the polynomial overdetermined. As long as it receives "many" of the points correctly, the receiver can recover the original polynomial even in the presence of a "few" bad points. Again, as one non-limiting example, a processor or hardware unit coupled to error checking unit 34A may be considered as the receiver that detects and corrects errors.

First error-related code generating unit 18A may generate the first error-related code utilizing, as a non-limiting example, one of the algorithms described above and combine with the first error-related code with the write data to generate a write data stream, also referred to as a first data stream. The write data stream travels through data path 32A. As described above, the various units shown in data storage device 16 may be formed on one or more ICs or at least one processor 11 (FIG. 1). In some examples, data path 32A may include various paths through an IC or at least one processor 11. For example, the IC may include amplifiers and rectifiers. In these examples, data path 32A may comprise the path through the amplifiers and rectifiers. In some examples, data path 32A may include a path off chip, i.e., path out of the IC, and into another IC that includes transform unit 20A. In some examples, data path 32A may include a path off chip to a memory device, such as cache memory, and back into the chip. In some examples, data path 32A may include a path through combinational and sequential elements internal to the IC. In some examples, data path 32A may include a path to a memory device on chip. Generally data path 32A may include any path within the one or more ICs or external to the one or more ICs where the write data stream may become corrupted. The data out of data path 32A may be considered as processed data. In other words, data path 32A receives write data stream and outputs processed write data stream, or processed first data stream.

In some non-limiting examples, data storage device 16 includes error checking unit 34A. Error checking unit 34A may not be necessary in every example of data storage device 16. In examples of data storage device 16 that include error checking unit 34A, data path 32A outputs the processed write data stream to error checking unit 34A and transform unit 20A.

Error checking unit 34A may be formed within the same one or more ICs that include the various other units shown in FIGS. 1 and 2. Alternatively, error checking unit 34A may be formed on a separate IC. Error checking unit 34A determines whether there are any corrupted bits in the write data stream after the write data stream traveled through data path 32A.

Error checking unit 34A comprises an error-related code generator and an error-related code checker. The error-related code generator of error checking unit 34A generates an error-related code based on the write data portion of the write data stream. The error-related code generator of error checking unit 34A generates the error-related code utilizing the same algorithm that first error-related code generating unit 18 utilized. The error-related code checker compares the code generated by error-related code generator of error checking unit 34A with the first error-related code generated by first error-related code generating unit 18A and processed via data path 32A. If the two codes match, e.g., both codes comprise the exact same bits in the exact same order, the error-related code checker of error checking unit 34A determines that there is no corruption in the write data stream after being processed through data path 32A. In other words, the processed data stream is substantially identical to the write data stream. However, if the two codes do not match, error-related code checker of error checking unit 34A may detect that one or more of the bits in the write data stream have been corrupted after the write data stream was processed through data path 32A. In other words, the processed data stream may be different than the write data stream.

As another example, error checking unit 34A may glean the first error-related code from the write data stream. Error checking unit 34A may then input the write data stream (i.e., the first error-related code combined with the write data) and the first error-related code gleaned from the write data stream into the error-related code checker. The error-related code checker may generate a result based on the write data stream and the first error-related code. The algorithm used by the error-related code checker may be such that if the output of the error-related code checker is non-zero, error checking unit 34 may determine that there is an error in the write data stream. If the output of the error-related code checker is zero, error checking unit 34A may determine that the write data stream is uncorrupted.

In some examples, after error checking unit 34A detects that one or more of the bits in the write data stream have been corrupted after traveling through data path 32A, error checking unit 34A may transmit an alarm condition to host interface unit 12 (shown as the dashed line). In response to the alarm condition, in some examples, host interface unit 12 may retransmit the write data to first error-related code generating unit 18A.

In some examples, where the first error-related code is an ECC, though not shown in FIG. 3, data storage device 16 may comprise a memory device and a processor coupled between data path 32A and transform unit 20A. The processor may be formed within the same one or more ICs as the other units shown in FIG. 3. The memory device may be off chip and formed in a separate IC or may be formed within the processor. In these examples, data path 32A may not transmit the write data stream to transform unit 20A. Rather, the processed write data stream may be temporarily stored in the memory device. If error checking unit 34A detects corrupt bits in the processed write data stream, error checking unit 34A may transmit the alarm condition to the processor. The processor in response may utilize the first error-related code to correct the corrupted bits. The processor may then cause the memory device to transmit the corrected write data stream to transform unit 20A. If error checking unit 34A does not detect corrupt bits in the write data stream, error checking unit 34A may transmit a condition to the processor indicating that there are no corrupt bits. In response, the processor may cause the memory device to transmit the processed write data stream to transform unit 20A in examples where the first error-related code is an ECC.

In some examples, instead of or in addition to a processor, a hardware unit may be coupled with the memory device. The hardware unit may be configured to perform error correction on the fly. The hardware unit may be specially configured to perform only error correction. Accordingly, in some examples of error correction, data storage device 16 may include at least one processor that performs the error correction, at least one hardware unit that performs the error correction, or a combination of at least one hardware unit and at least one processor that perform the error correction.

Transform unit 20A shown in FIG. 3 is an example of transform unit 20 shown in FIG. 1. Transform unit 20A receives the processed write data stream and transforms the processed write data stream. For example, transform unit 20A may encrypt the processed write data stream or may compress the processed write data stream. Encryption and compression are provided for illustration purposes only and should not be considered as limiting. After transformation via transform unit 20A, the first error-related code and the write data in the processed write data stream may become commingled and it may be difficult to delineate between the first error-related code and the write data. Transform unit 20A may transmit the transformed data stream to second error-related code generating unit 22A.

Second error-related generating unit 22A shown in FIG. 3 is an example of second error-related generating unit 22 shown in FIG. 1. Second error-related code generating unit 22A may generate a second error-related code based on the transformed data stream. The second error-related code may be an EDC or ECC. Second error-related code generating unit 22A may combine the transformed data stream and the second error-related code to generate a second data stream. In the second data stream, it may be possible to delineate between the transformed data stream and the second error-related code. However, it may not be possible to delineate between the first error-related code and the write data in the transformed data stream.

In some examples, second error-related code may be a parity bit, checksum, cyclic redundancy checks (CRC) code, or a hash function output as some non-limiting examples of the second error-related code in examples where the second error-related code is an EDC. In some examples, second error-related code may be a FEC code, a Reed-Solomon code, Hamming code, or optimal rectangular code as some non-limiting examples of the second error-related code in examples where the second error-related code is an ECC. In some examples, second error-related code generating unit 22A may utilize the same algorithm to generate the second error-related code that first error-related code generating unit 18A utilized to generate the first error-related code. In some examples, second error-related code generating unit 22A may utilize a different algorithm to generate the second error-related code that first error-related code generating unit 18A utilized to generate the first error-related code. In some examples, both the first error-related code and the second error-related code may be EDCs or ECCs. In some examples, the first error-related code may be an EDC and the second error-related code may be an ECC, or vice-versa.

Data path 36A receives the second data stream. In some examples, data path 36A may be similar to data path 32A albeit in a different section than data path 32A in the one or more ICs. In some examples, data path 36A may comprise a path to an off chip cache memory and back to the one or more ICs. Similar to data path 32A, data path 36A may include any path within the one or more ICs or external to the one or more ICs where the second data stream may become corrupted.

Data path 36A receives the second data stream and outputs processed second data stream.

Similar to error checking unit 34A, in some non-limiting examples, data storage device 16 includes error checking unit 38A. Error checking unit 38A may not be necessary in every example of data storage device 16. In examples of data storage device 16 that include error checking unit 38A, data path 36A outputs the processed second data stream to error checking unit 38A and media storage unit 24A.

Error checking unit 38A may be formed within the same one or more ICs that include the various other units shown in FIGS. 1 and 2. Alternatively, error checking unit 38A may be formed on a separate IC. Error checking unit 38A determines whether there are any corrupted bits in the second data stream after the second data stream traveled through data path 36A. In other words, error checking unit 38A determines whether there are any corrupted bites in the processed second data stream.

Like error checking unit 34A, error checking unit 38A comprises an error-related code generator and an error-related code checker. The error-related code generator of error checking unit 38A generates an error-related code based on the transformed data portion of the second data stream. The error-related code generator of error checking unit 38A generates the error-related code utilizing the same algorithm that second error-related code generating unit 22A utilized. The error-related code checker compares the code generated by error-related code generator of error checking unit 38A with the second error-related code generated by second error-related code generating unit 22A and processed via data path 36A. If the two codes match, e.g., both codes comprise the exact same bits in the exact same order, the error-related code checker of error checking unit 38A determines that there is no corruption in the second data stream after being processed through data path 36A. In other words, the processed second data stream is substantially identical to the second data stream. However, if the two codes do not match, error-related code checker of error checking unit 38A may detect that one or more of the bits in the second data stream have been corrupted after the second data stream was processed through data path 36. In other words, the processed second data stream may be different than the second data stream.

In some examples, error checking unit 38A may input the second error-related code and the second data stream into the error-related code checker. If the output of the error-related code checker is non-zero based on the second error-related code and the second data stream, error checking unit 38A may determine that there is an error in the second data stream. Conversely, if the output is zero, error check unit 38A may determine that the second data stream is uncorrupted.

In some examples, after error checking unit 38A detects that one or more of the bits in the second data stream have been corrupted after traveling through data path 36A, error checking unit 38A may transmit an alarm condition to host interface unit 12 (shown as the dashed line). In response to the alarm condition, in some examples, host interface unit 12 may retransmit the write data to first error-related code generating unit 18A.

In some examples, where the second error-related code is an ECC, though not shown in FIG. 3, data storage device 16 may comprise a memory device and a processor or hardware unit coupled between data path 36A and media storage unit 24A. The processor may be formed within the same one or more ICs as the other units shown in FIG. 3. The memory device may be off chip and formed in a separate IC or may be formed on the processor. In some examples, the processor or hardware unit and memory device coupled between data path 36A and media storage 24A may be the same processor or hardware unit and memory device coupled between data path 32A and transform unit 20A. In these examples, data path 36A may not transmit the second data stream to media storage unit 24A. Rather, the processed second data stream may be temporarily stored in the memory device. If error checking unit 38A detects corrupts bits in the second data stream, error checking unit 38A may transmit the alarm condition to the processor or hardware unit. The processor or hardware unit in response may utilize the second error-related code to correct the corrupted bits. The processor or hardware unit may then cause the memory device to transmit the corrected second data stream to media storage unit 24A. If error checking unit 38A does not detect corrupt bits in the processed second data stream, error checking unit 38A may transmit a condition to the processor or hardware unit indicating that there are no corrupt bits. In response, the processor or hardware unit may cause the memory device to transmit the processed second data stream to media storage unit 24A in examples where the second error-related code is an ECC.

Media storage unit 24A may receive and store the processed second data stream. When host interface unit 12 desires to read the written data from media storage unit 24A, media storage unit 24A transmits the processed second data stream via data path 42A. In some non-limiting examples, error checking unit 40A may determine whether any bits in the second data stream became corrupted within media storage unit 24A.

Error checking unit 40A may be substantially similar to error checking unit 38A. For example, error checking unit 40A may not be necessary in every example of data storage device 16.

Error checking unit 40A may generate an error-related code based on the transformed data stream of the retrieved second data stream utilizing the same algorithm that second error-related code generating unit 22A utilized. If error-related code generated by error checking unit 40A matches the retrieved second error-related code of the retrieved second data stream, then error checking unit 40A may determine that there are no corrupted bits in the retrieved second data stream. In other words, the retrieved second data stream is substantially identical to the stored second data stream. If the error-related code generated by error checking unit 40A does not match the retrieved second error-related code of the retrieved second data stream, then error checking unit 40A may detect that there are corrupted bits and may transmit an alarm condition to host interface unit 12 (shown as the dashed line) indicating that the retrieved bits are corrupt. In other words, the retrieved second data stream may be different than the stored second data stream.

In some examples, where the second error-related code is an ECC, a processor or hardware unit and memory device may be coupled between media storage unit 24A and data path 42A. In these examples, media storage unit 24A may not transmit the retrieved second data stream to data path 42A. Rather, the memory device may temporarily store the retrieved second data stream. If error checking unit 40A detects corrupted bits in the retrieved second data stream, the processor or hardware unit may correct the corrupted bits and cause the memory device to transmit the corrected second data stream to data path 42A. If there are no corrupt bits, the processor or hardware unit causes the memory device to transmit the retrieved second data stream to data path 42A. The processor or hardware unit and memory device coupled between media storage unit 24A and data path 42A may be the same processor or hardware unit and memory device that is coupled between data path 36A and media storage 24A in examples when the second error-related code is an ECC. The processor or hardware unit and memory device coupled between media storage unit 24A and data path 42A may be the same processor or hardware unit and memory device that is coupled between data path 32A and transform unit 20A in examples when the second error-related code and the first error-related code is an ECC.

Data path 42A may be substantially similar to data path 32A, 36A albeit at a different location within the one or more processors. Similar to data path 32A, 36A, data path 42A may be any path that may corrupt the retrieved second data stream. The output of data path 42A may be considered as a processed retrieved second data stream.

Error checking unit 44A may be substantially similar to error checking unit 40A. For example, error checking unit 44A may not be necessary in every example of data storage device 16. Error checking unit 44A may generate an error-related code based on the transformed data stream of the processed retrieved second data stream utilizing the same algorithm that second error-related code generating unit 22A utilized. As before, if error-related code generated by error checking unit 44A matches the processed retrieved second error-related code of the processed retrieved second data stream, then error checking unit 44A may determine that there are no corrupted bits in the processed retrieved second data stream. In other words, the processed retrieved second data stream is substantially identical to the retrieved second data stream. If the error-related code generated by error checking unit 44A does not match the processed retrieved second error-related code of the processed retrieved second data stream, then error checking unit 44A may detect that there are corrupted bits and may transmit an alarm condition to host interface unit 12 (shown as the dashed line) indicating that the retrieved bits are corrupt. In other words, the processed retrieved second data stream may be different than the retrieved second data stream.

In examples where the second error-related code is an ECC, a processor and memory device in association with error checking unit 44A may correct any corrupt bits in the processed retrieved second data stream. The processor and memory device may be the same processor and memory device described above with respect to data path 32A and transform unit 20A, data path 36A and media storage unit 24A, and media storage unit 24A and data path 42A.

Second error-related code removing unit 26A shown in FIG. 3 is an example of second error-related code removing unit 26 shown in FIG. 1. Second error-related code removing unit 26A may receive the processed retrieved second data stream and remove the second error-related code. The processed retrieved second data stream comprises the processed retrieved second error-related code and the processed retrieved transformed data stream. In some examples, the second error-related code may be appended to the transformed data stream and the length of the second error-related code may be 2 bytes. Second error-related code removing unit 26A may remove the last 2 bytes of the processed retrieved second data stream in this non-limiting example. After the second error-related code is removed, the processed transformed data stream may be the only portion remaining from the processed retrieved second data stream.

Inverse transform unit 28A shown in FIG. 3 is an example of inverse transform unit 28 shown in FIG. 3. Inverse transform unit 28A may receive the processed retrieved transformed data stream from second error-related code removing unit 26A. Inverse transform unit 28A may inverse transform the processed retrieved transformed data. Inverse transform unit 28A may perform the inverse function of the transform unit 20A. For example, if transform unit 20A encrypted the data, then inverse transform unit 28A may decrypt the data. Similarly, if transform unit 20A compressed the data, then inverse transform unit 28A may decompress the data.

After inverse transform unit 28A inverse transforms the transformed data stream, the output stream from inverse transform unit 28A may be considered as an inverse transformed data. The inverse transformed data includes an inverse transformed data stream and an inverse transformed error-relate code. Notably, after inverse transformation, it may be possible to delineate between the inverse transformed data stream and the inverse transformed error-related code. The inverse transformed data stream may be substantially identical to the data that was written by host interface unit 12, e.g., write data, assuming none of the bits became corrupted during the inverse transformation. The inverse transformed error-related code may be substantially similar to the first error-related code, assuming none of the bits became corrupted during the inverse transformation.

In some non-limiting examples, error-checking unit 46A may determine whether any bits became corrupted after inverse transformation. Similar to the other error-checking units, error-checking unit 46A may generate an error-related code based on the inversed transformed data stream and compare the error-related code to the inverse transformed error-related code. If the two error codes match, then error-checking unit 46A may determine that none of the bits became corrupted after inverse transformation. In other words, the inverse transformed data may be substantially identical to the write data stream that included the first error-related code and the write data that was originally transmitted by host interface unit 12. Alternatively, if the two error codes do not match, then error-checking unit 46A may determine that one or more of the bits in the inversed transformed data became corrupted. In other words, the inverse transformed data may be different than the write data stream.

In examples where the first error-related code is an ECC, a processor or hardware unit and memory device in association with error checking unit 46A may correct any corrupt bits in the inverse transformed data. The processor or hardware unit and memory device may be the same processor or hardware unit and memory device described above with respect to data path 32A and transform unit 20A, data path 36A and media storage unit 24A, media storage unit 24A and data path 42A, and data path 42A and second error-related code removing unit 26A.

Similar to the error checking units shown in FIG. 3, error checking unit 46A is shown for illustration purposes. Error checking unit 46A may not be necessary in every example of data storage device 16.

Data path 48A receives the inverse transformed data from inverse transform unit 28A. Data path 48A may be substantially similar to data path 32A, 36A, 42A albeit at a different location within the one or more processors. Similar to data path 32A, 36A, 42A, data path 48A may be any path that may corrupt the inverse transformed data. The output of data path 48A may be considered as a processed inverse transformed data.

First error-related code removing unit 30A shown in FIG. 3 is an example of first error-related code removing unit 30 shown in FIG. 1. First error-related code removing unit 30A may receive the processed inverse transformed data. To iterate, assuming no corrupted bits, the processed inverse transformed data includes a processed inverse transformed data stream that may be substantially identical to the data originally written by host interface unit and an processed inverse transformed error-related code that may be substantially similar to the first error-related code. Host interface unit 12 may desired to read the data that was originally written by host interface unit 12.

In some examples, the processed inverse transformed error-related code may be appended to the processed inverse transformed data stream and the length of the processed inverse transformed code may be 2 bytes. First error-related code removing unit 30A may remove the last 2 bytes of the processed inverse transformed data in this non-limiting example. After the processed inverse transform error-related code is removed, the processed inverse transformed data stream may be the only portion remaining from the processed inverse transformed data. Notably, the processed inverse transformed data may be substantially identical to the write data, originally transmitted from host interface unit 12 to data storage device 16, that host interface unit 12 now desires to read.

Host interface unit 12 receives the processed inverse transformed data. In this manner host interface unit 12 reads data from data storage device 16.

As described above, utilizing two different error-related codes, i.e., a first error-related code and a second error-related code, allows data storage device 16 to detect corrupt bits and localize paths or units within data storage device 16 where the corruption occurred. After data storage device 16 determines where the corruption occurs, in some examples, data storage device 16 may correct the corrupt bits or indicate that the bits are corrupt to host interface unit 12 at a sufficiently early stage of the data flow. Host interface unit 12 may then take corrective steps such as retransmitting the data to correct for the corrupt bits. Without such early detection of corrupted bits, erroneous bits may propagate through data storage device 16 and never be detected.

Notably, in accordance with some aspects of this disclosure, data storage device 16 is capable of detecting corrupt bits in the data to be written to media storage unit 24A before the data is transformed and even after the data is transformed. Similarly, data storage device 16 is capable of detecting corrupt bits in the data to be read from media storage unit 24A before the data is inverse transformed and even after the data is inverse transformed. In this manner, the various aspects of this disclosure promote robust error detection and correction techniques.

Figure 4:
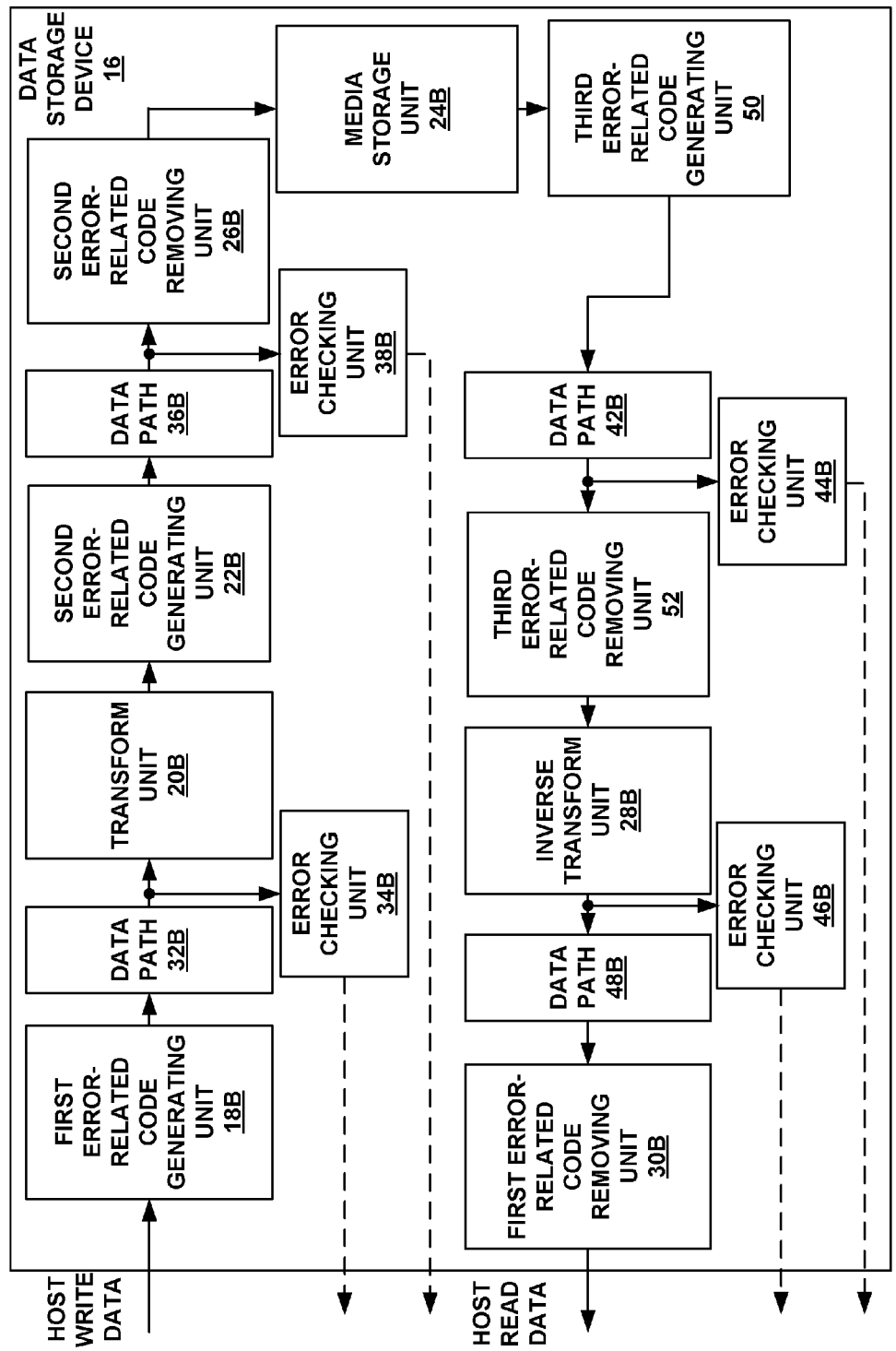
FIG. 4 is a block diagram illustrating details of another example of the data storage device shown in FIG. 1.

FIG. 4 is a block diagram illustrating details of another example data storage device 16 of FIG. 1. The example data storage device 16 shown in FIG. 4 is substantially similar to the example data storage device 16 shown in FIG. 3. However, as shown in FIG. 4, data path data path 36B may transmit to second error-related code removing unit 26B instead of data path 36A transmitting to media storage unit 24A as shown in FIG. 3. Data path 36B as shown in FIG. 4 may be substantially similar to data path 36A of FIG. 3.

Second error-related code removing unit 26B shown in FIG. 4 may be an example of second error-related code removing unit 26 shown in FIG. 1. Second error-related code removing unit 26B may be substantially similar to second error-related code removing unit 26A shown in FIG. 3. After second error-related code removing unit 26B removes the second error-related code, the output of second error-related code removing unit 26B includes the processed transformed data stream. Similar to FIG. 3, the processed transformed data stream in FIG. 4 includes the commingled processed write data and processed first error-related code. In the processed transformed data stream it may be difficult to delineate between the processed write data and the processed first error-related code.

Media storage unit 24B shown in FIG. 4 is an example of media storage unit 24 shown in FIG. 1. Media storage unit 24B may store different data then media storage unit 24A shown in FIG. 3. In the example data storage device 16 shown in FIG. 4, media storage unit 24B stores the processed transformed data stream from second error-related code removing unit 26B. In FIG. 3, as described above, media storage unit 24A stores the processed transformed data stream with the combined second error-related code.

In the example data storage device 16 shown in FIG. 4, media storage unit 24B outputs to third error-related code generating unit 50 rather than data path 42A as shown in FIG. 3. Third error-related code generating unit 50 may generate a third error-related code based on the processed transformed data stream retrieved from media storage unit 24B. Third error-related code generating unit 50 may combine the third error-related code with the processed transformed data stream. In some examples, third error-related code generating unit 50 may utilize the same algorithm to the generate the third error-related code as the algorithm utilized by either first error-related code generating unit 18B or second error-related code generating unit 22B. Alternatively, in some examples, third error-related code generating unit 50 may utilize a different algorithm to the generate the third error-related code as the algorithm utilized by first error-related code generating unit 18B and/or second error-related code generating unit 22B. First error-related code generating unit 18B is an example of first error-related code generating unit 18 shown in FIG. 1.

As shown in FIG. 4, data path 42B transmits to third error-related code removing unit 52. Data path 42B may be substantially similar to data path 42A shown in FIG. 3. Third error-related code removing unit 52 may remove the third error-related code in a substantially similar manner as first error-related code removing unit 30B or second error-related code removing unit 26B. For example, third error-related code removing unit 52 may remove the last 2 bytes of the data received from data path 42. The last 2 bytes of the data received from data path 42 may include the third error-related code. First error-related code removing unit 30B is an example of first error-relate code removing unit 30 shown in FIG. 1.

Figure 5:
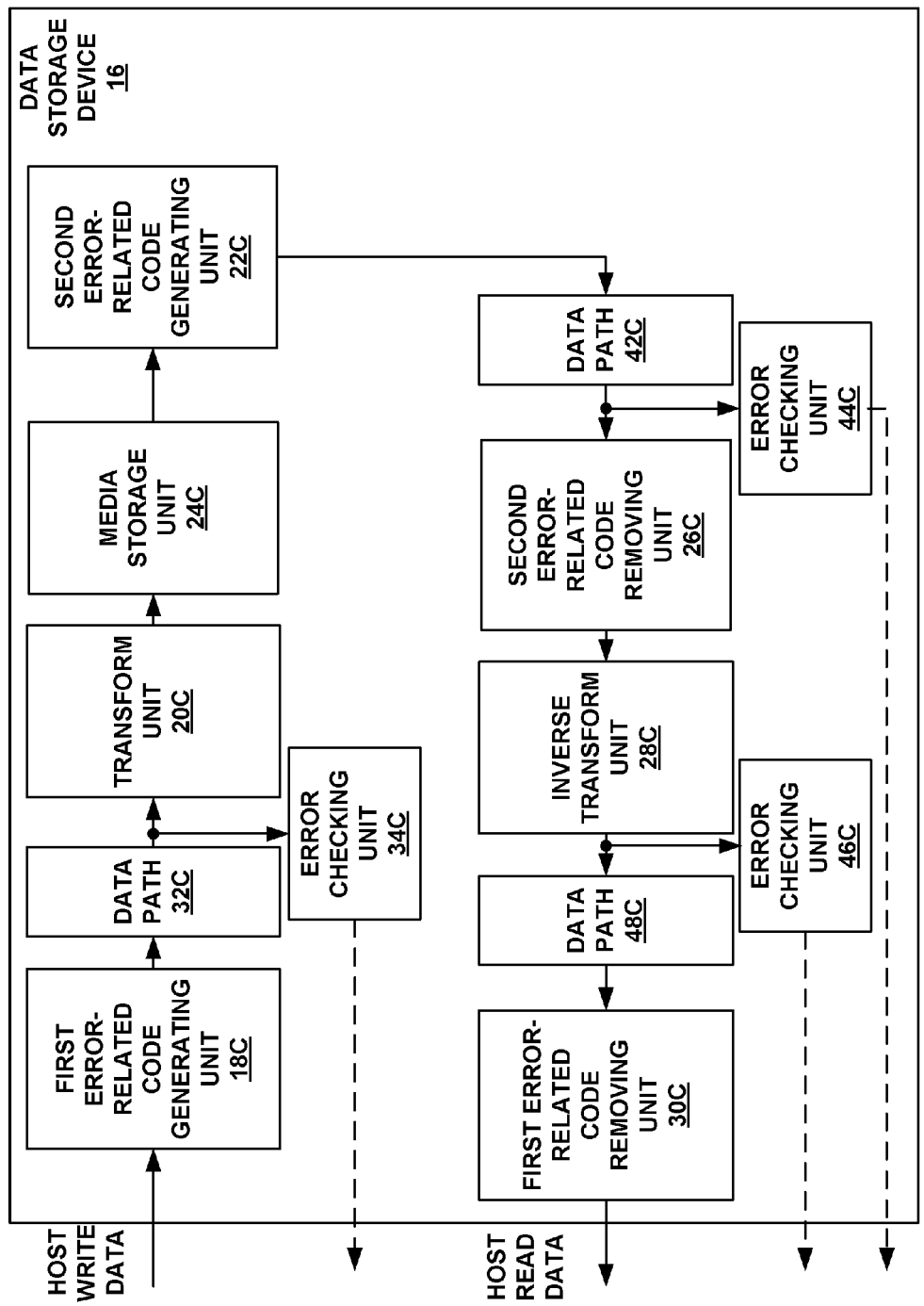
FIG. 5 is a block diagram illustrating details of another example of the data storage device shown in FIG. 1.

FIG. 5 is a block diagram illustrating details of another example data storage device 16 of FIG. 1. The example data storage device 16 shown in FIG. 5 is substantially similar to the data storage device 16 shown in FIGS. 1, 3, and 4. However, as shown in FIG. 5, transform unit 20C transmits data to media storage unit 24C. Transform unit 20C is an example of transform unit 20 shown in FIG. 1. Media storage unit 24C is an example of media storage unit 24 shown in FIG. 1. In the example data storage device 16 shown in FIG. 5, media storage unit 24C stores the transformed data stream. To reiterate, the processed transformed data stream includes the commingled processed write data and processed first error-related code. In the processed transformed data stream it may be difficult to delineate between the processed write data and the processed first error-related code.

As shown in FIG. 5, media storage unit 24C transmits data to second error-related code generating unit 24C rather than data path 42A as shown in FIG. 3. Second error-related code generating unit 24C shown in FIG. 5 is an example of second error-related code generating unit 24 shown in FIG. 1. As shown in FIG. 5, second error-related code generating unit 24C transmits the second error-related code combined with the processed transformed data to data path 42C. Data path 42C may be substantially similar to data path 42B shown in FIG. 4 and data path 42A shown in FIG. 3. The remaining units for the path to read data from media storage unit 24C may be substantially similar to and may perform substantially similar functions as shown and described with respect to FIGS. 3 and 4.

Figure 6:
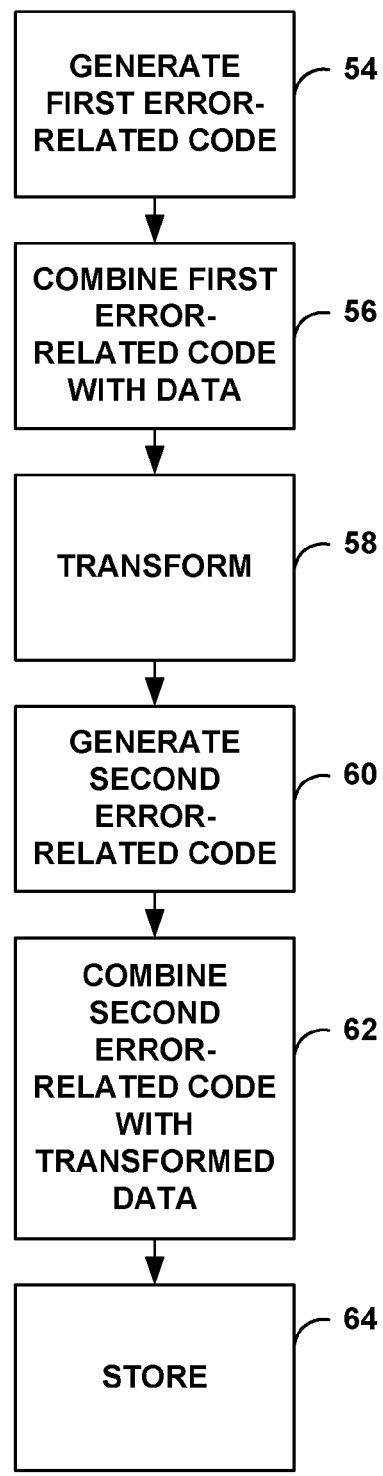
FIG. 6 is a flowchart illustrating an example operation of the example data storage device shown in FIG. 1.

FIG. 6 is a flowchart illustrating an example operation of data storage device 16 shown in FIG. 1. For purposes of clarity and illustration, reference is made to FIG. 1. Data storage device 16 may perform the acts of FIG. 6 when host interface unit 12 writes data to media storage unit 24 in accordance with the example data storage device 16 shown in FIG. 1.

First error-related code generating unit 18 generates a first error-related code based on write data received from host interface unit 12 (54). In some examples, the first error-related code may be an EDC or an ECC. Upon generation of the first error-related code, first error-related code generating unit 18 may combine the first error-related code and the write data to generate a write data stream, which may also be referred to as a first data stream (56). In some non-limiting examples, to combine the first error-related code and the write data, first error-related code generating unit 18 may append the first error-related code and the write data. In some other examples, to combine the first error-related code and the write data, first error-related code generating unit 18 may add the first error-related code to the beginning of the write data. In yet some other examples, to combine the first error-related code and write data, first error-related code generating unit 18 may place the first error-related code within the write data.

Transform unit 20 may receive the first data stream and transform the first data stream (58). Transform unit 20 may encrypt or compress the first data stream. After transformation, the first error-related code and the write data may be commingled making it difficult to delineate between the first error-related code and the write data. Transform unit 20 may generate a transformed data stream.

Second error-related code generating unit 22 may receive the transformed data stream and generate a second error-related code (60). Upon generation of the second error-related code, second error-related code generating unit 22 may combine the second error-related code and the transformed data stream to generate a second data stream (62). To combine the second error-related code with the transformed data stream, second error-related code generating unit 22 may append the second error-related code to the transformed data stream, add the second error-related code at the beginning of the transformed data stream, or add the second error-related code within the transformed data stream.

Second error-related code generating unit 22 may transmit the second data stream to media storage unit 24. Media storage unit 24 may store the second data stream (64).

Figure 7:
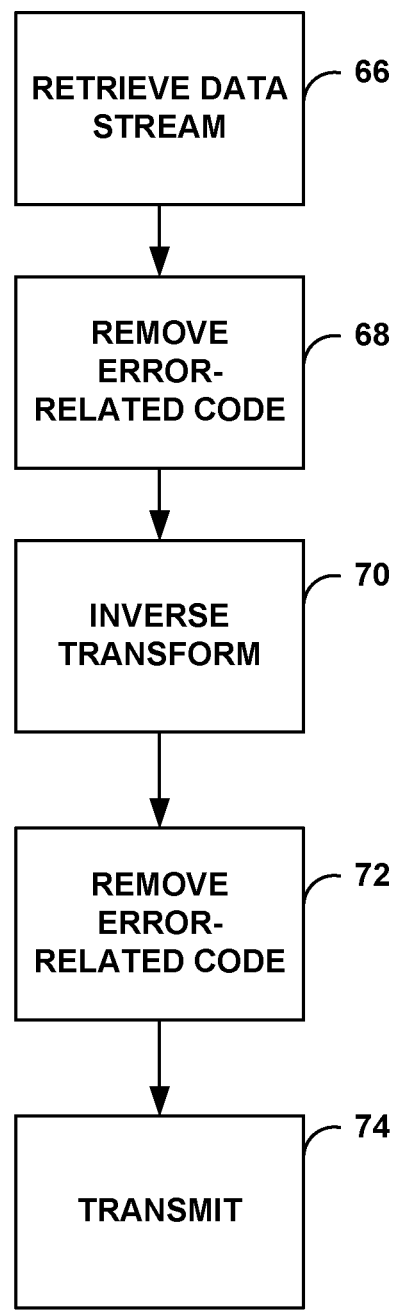
FIG. 7 is a flowchart illustrating another example operation of the example data storage device shown in FIG. 1.

FIG. 7 is a flowchart illustrating another example operation of data storage device 16 shown in FIG. 1. For purposes of clarity and illustration, reference is made to FIG. 1. Data storage device 16 may perform the acts of FIG. 7 when host interface unit 12 reads data from media storage unit 24 in accordance with the example data storage device 16 shown in FIG. 1.

Second error-related code removing unit 26 retrieves a data stream from media storage unit 24 (66). The retrieved data stream from media storage unit 24 includes a combination of a second error-related code generated by second error-related code generating unit 22 and transformed data transformed by transform unit 20. Second error-related code removing unit 26 removes the second error-related code (68) to generate a retrieved transformed data stream.

Inverse transform unit 28 receives the retrieved transformed data stream and inverse transforms the retrieved transformed data stream (70). Inverse transform unit 28 may perform the inverse function of transform unit 20. Inverse transform unit 28 generates a retrieved inverse transformed data stream. Notably, the retrieved inverse transformed data stream may be substantially similar to the first error-related code combined with the write data where the first error-related code was generated by first error-related code generating unit 18 and the write data is the data that host interface unit 12 desires to read.

First error-related code removing unit 30 receives the retrieved inverse transformed data stream and removes the first error-related code (72). After first error-related code removing unit 30 removes the first error-related code, the remaining data stream may include only the retrieved inverse transformed data stream. The retrieved inverse transformed data stream may be substantially identical to the data originally written by host interface unit 12 that host interface unit 12 now desires to read. First error-related code removing unit 30 may then transmit the retrieved inverse transformed data stream to host interface unit 12 (74).

Figure 8:
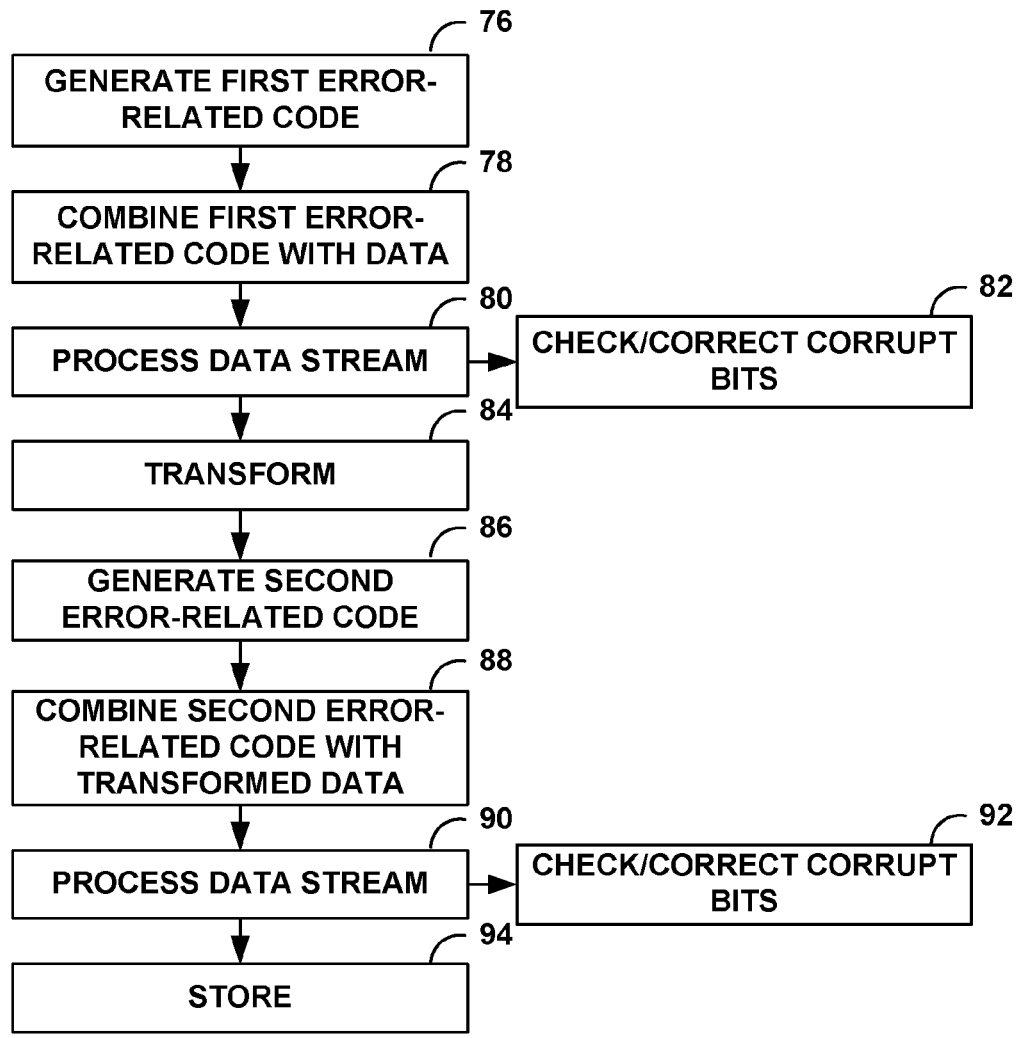
FIG. 8 is a flowchart illustrating an example operation of the example data storage device shown in FIG. 3.

FIG. 8 is a flowchart illustrating an example operation of data storage device 16 shown in FIG. 3. For purposes of clarity and illustration, reference is made to FIG. 3. Data storage device 16 may perform the acts of FIG. 8 when host interface unit 12 writes data to media storage unit 24A in accordance with the example data storage device 16 shown in FIG. 3.

Acts 76 and 78 of FIG. 7 may be substantially similar to acts 54 and 56 of FIG. 5. First error-related code generating unit 18A generates a first error-related code based on write data received from host interface unit 12 (76). Upon generation of the first error-related code, first error-related code generating unit 18A may combine the first error-related code and the write data to generate a write data stream, which may also be referred to as a first data stream (78).

Data path 32A may process the write data stream to generate a processed write data stream (80). Data path 32A may be any path through one or more ICs or out of one IC and back into an IC that may corrupt bits of the write data stream. Error checking unit 34A may determine whether any of the bits in the write data stream became corrupted through data path 32A (82). In some examples, in addition to detecting whether any of bits became corrupted, error checking unit 34A may correct any of the corrupted bits. Also, in some examples, if the error checking unit 34A determines that at least one of the bits became corrupted, error checking unit 34A may transmit an alarm signal to host interface unit 12 indicating that the data became corrupted through data path 32A. In response, host interface unit 12 may retransmit the write data.

Transform unit 20A may transform the processed write data stream (84). Transform unit 20A may generate a transformed data stream. In the transformed data stream, it may be difficult to delineate between the first error-related code and the write data.

Second error-related code generating unit 22A may receive the transformed data stream and generate a second error-related code based on the transformed data stream (86). Second error-related code generating unit 22A may combine the second error-related code and the transformed data stream to generate a second data stream (88).

Data path 36A may process the second data stream to generate a processed second data stream (90). Similar to data path 32A, data path 36A may be any path that may corrupt bits of the second data stream. Similar to error checking unit 34A, error checking unit 38A may determine whether any of the bits in the second data stream became corrupted through data path 36 (92). In some examples, in addition to detecting whether any of bits became corrupted, error checking unit 38A may correct any of the corrupted bits. Also, in some examples, if the error checking unit 38A determines that at least one of the bits became corrupted, error checking unit 38A may transmit an alarm signal to host interface unit 12 indicating that the data became corrupted through data path 36A. In response, host interface unit 12 may retransmit the write data.

Media storage unit 24A may store the processed second data stream (94). Notably, the processed second data stream includes a processed second error-related code and the processed transformed data. In the second data stream, it may be possible to delineate between the second error-related code and the transformed data.

Figure 9:
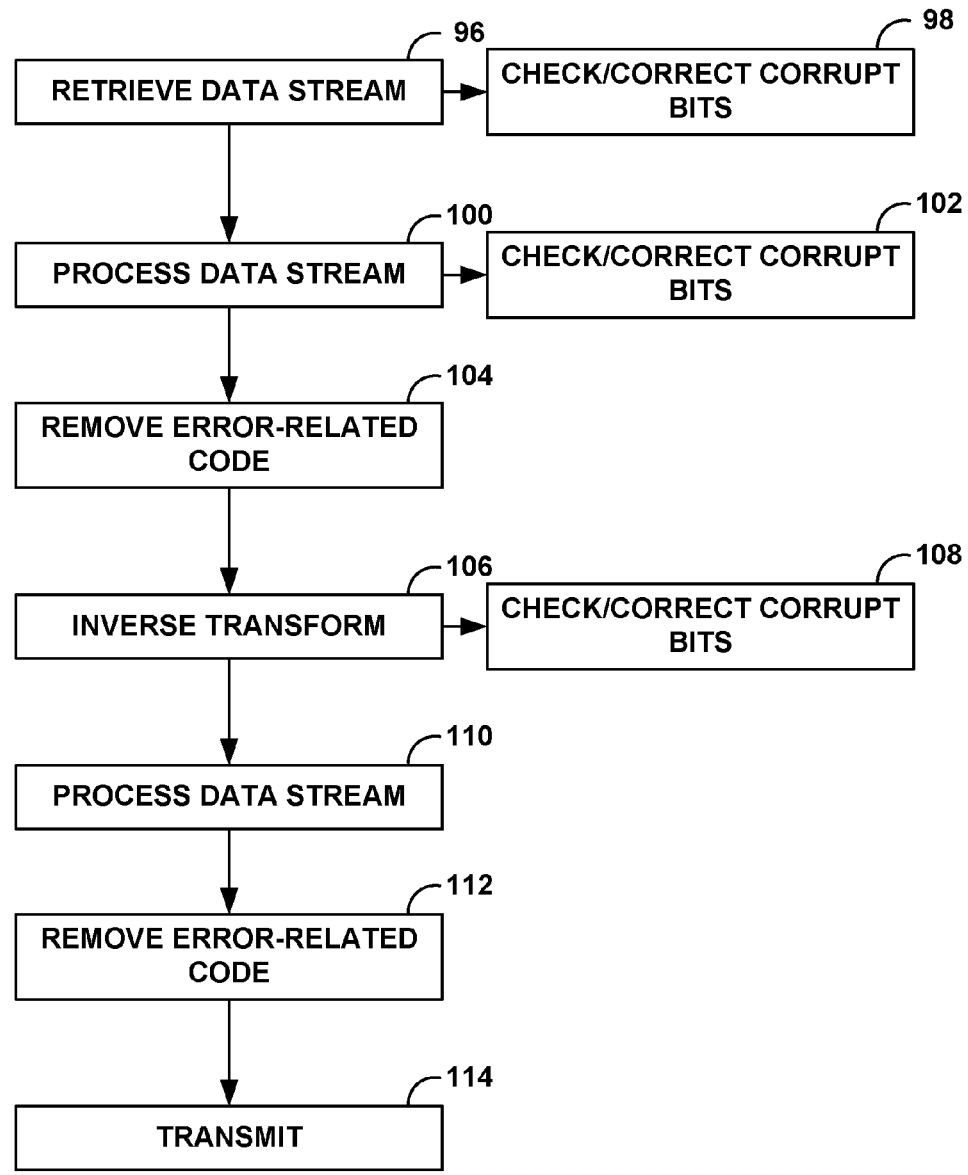
FIG. 9 is a flowchart illustrating another example operation of the example data storage device shown in FIG. 3.

FIG. 9 is a flowchart illustrating another example operation of data storage device 16 shown in FIG. 3. For purposes of clarity and illustration, reference is made to FIG. 3. Data storage device 16 may perform the acts of FIG. 9 when host interface unit 12 reads data from media storage unit 24A in accordance with the example data storage device 16 shown in FIG. 3.

Data path 42A and error checking unit 40A retrieve the data stream stored in media storage unit 24A (96). Notably, the data stream retrieved from media storage unit 24A includes a second error-related code and transformed data. The transformed data includes commingled first error-related code and data the host interface unit 12 desires to read that have been transformed.

Error checking unit 40A may determine whether any of the bits in the retrieved data stream became corrupted during storage in media storage unit 24A (98). In some examples, in addition to detecting whether any of bits became corrupted, error checking unit 40A may correct any of the corrupted bits. Also, if error checking unit 40A determines that some of the bits in the retrieved data stream became corrupted, error checking unit 40A may transmit an alarm condition to host interface unit 12 indicating that the data stored in media storage unit 24A became corrupted.

Data path 42A may process the retrieved data stream to generate a processed retrieved data stream (100). Data path 42A may be any data path that may corrupt the retrieved data stream.

Error checking unit 44A may determine whether any of the bits of the processed retrieved data stream became corrupted through data path 42A (102). Similar to error checking unit 40A, in some examples, error checking unit 40A may correct nay of the corrupted bits. In some examples, if error checking unit 40A determines that some of the bits of the processed retrieved data stream became corrupted, error checking unit 40A may transmit an alarm condition to host interface unit 12 indicating that data path 42A may have corrupted the retrieved data stream.

Second error-related code removing unit 26A may receive the processed retrieved data stream and remove the second error-related code (104). Notably, after second error-related code removing unit 26A removes the second error-related code the remaining data stream includes the transformed data stream. Inverse transform unit 28A may inverse transform the transformed data stream (106). Inverse transform unit 28A may perform the inverse function of transform unit 20A. After inverse transformation, it may be possible to delineate between the first error-related code and the data that host interface unit 12 desires to read.

Error checking unit 46A may determine whether any of the bits became corrupted during the inverse transformation (108). Similar to the other error checking units, in some examples, error checking unit 46A may correct the corrupted bits, and in some examples, transmit an alarm signal to host interface unit 12 indicating that the inverse transformed bits because corrupted. Data path 48A may be receive the inverse transformed data stream and generate a processed inverse transformed data stream (110).

First error-related code removing unit 30A may remove the first error-related code (112). After first error-related code removing unit 30A removes the first error-related code, the remaining data stream includes the data that host interface unit 12 desires to read. First error-related code removing unit 30A may transmit the data that host interface unit 12 desires to read to host interface unit 12 (114).

Figure 10:
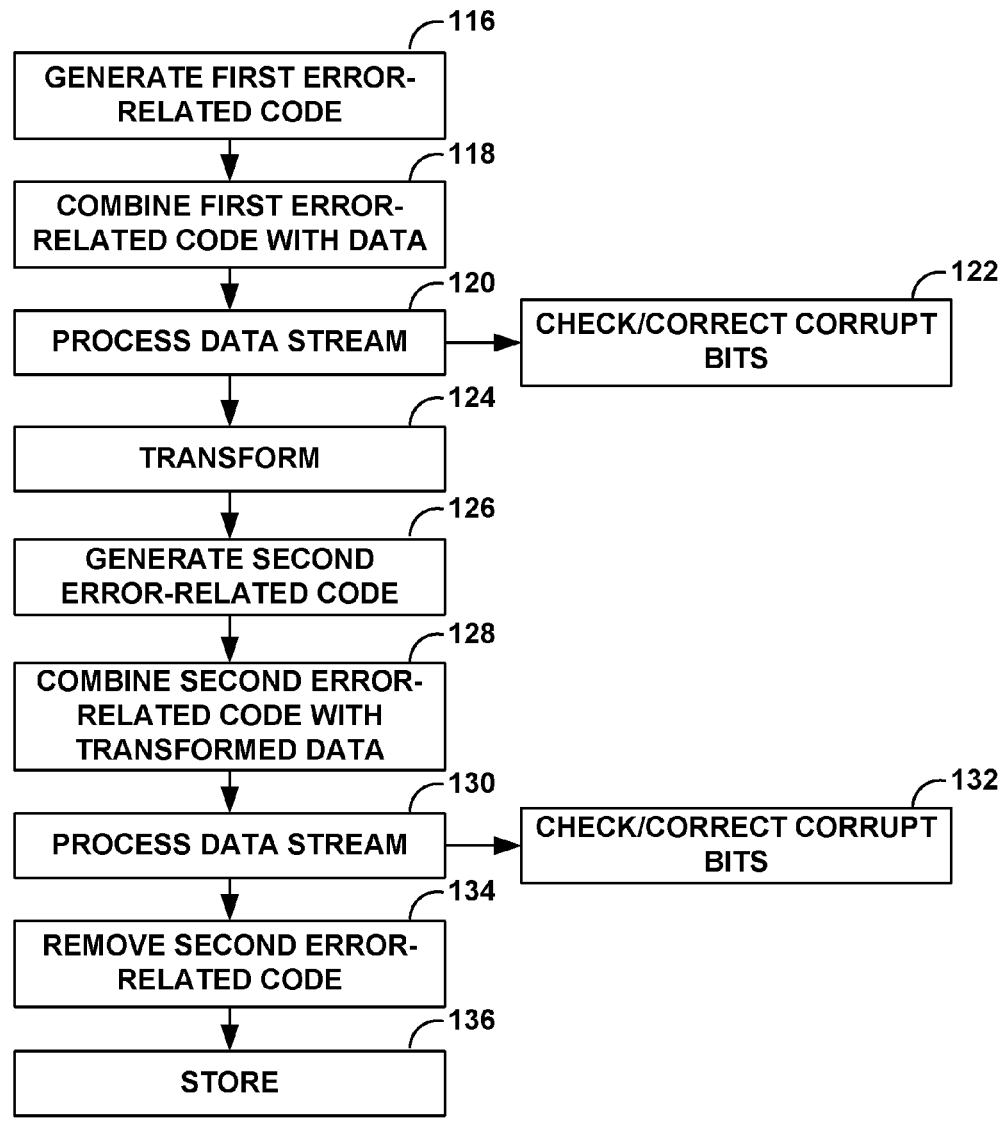
FIG. 10 is a flowchart illustrating an example operation of the example data storage device shown in FIG. 4.

FIG. 10 is a flowchart illustrating an example operation of data storage device 16 shown in FIG. 4. For purposes of clarity and illustration, reference is made to FIG. 4. Data storage device 16 may perform the acts of FIG. 10 when host interface unit 12 writes data to media storage unit 24B in accordance with the example data storage device 16 shown in FIG. 4.

Acts 116 through 132 of FIG. 10 may be substantially similar to acts 76 through 92 of FIG. 8. Accordingly, no further description of acts 116 through 132 of FIG. 10 is required. After data path 36B processes the data stream, as shown in FIG. 4, second error-related code removing unit 26B removes the second error-related code (134). Media storage unit 24B receives the data stream from second error-related code removing unit 26B and stores the data stream (136).

Figure 11:
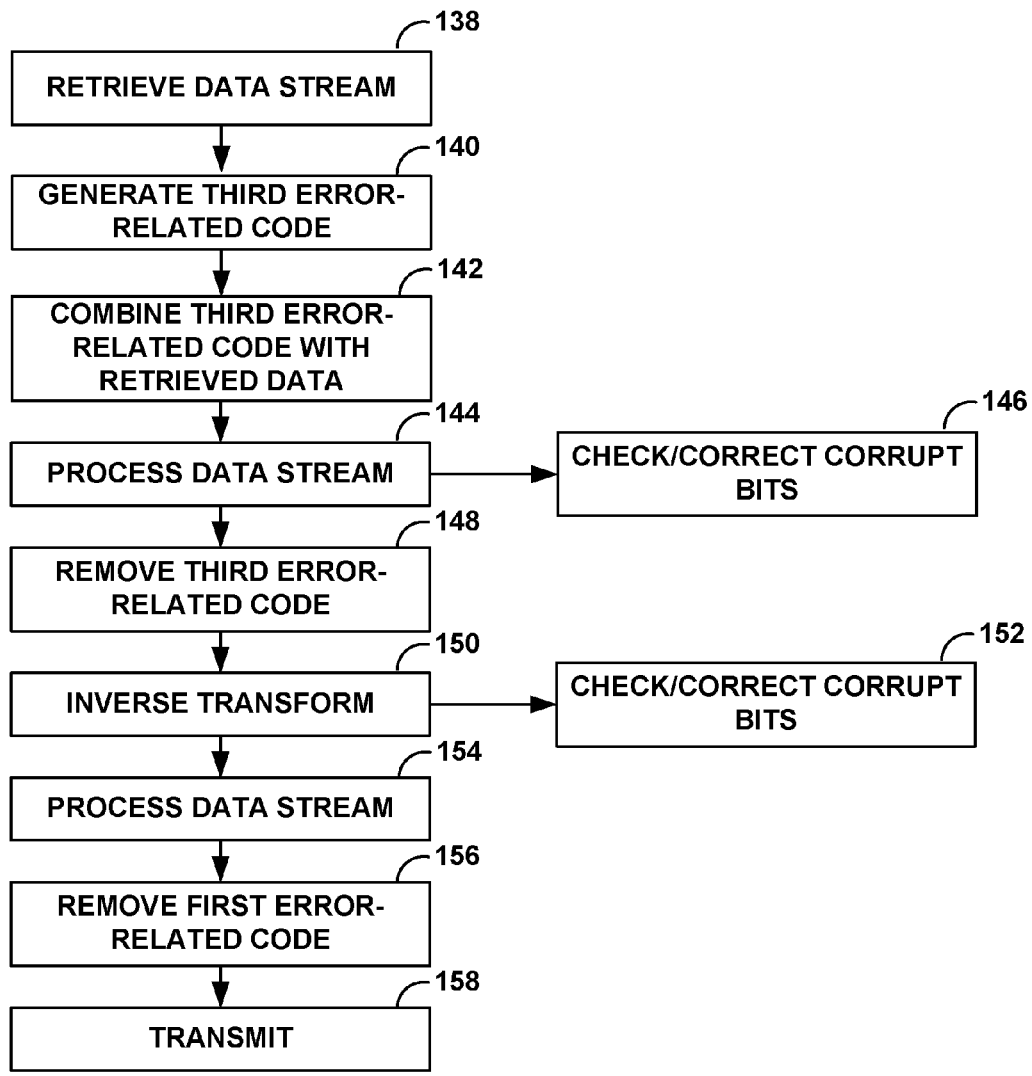
FIG. 11 is a flowchart illustrating another example operation of the example data storage device shown in FIG. 4.

FIG. 11 is a flowchart illustrating another example operation of data storage device 16 shown in FIG. 4. For purposes of clarity and illustration, reference is made to FIG. 4. Data storage device 16 may perform the acts of FIG. 11 when host interface unit 12 reads data from media storage unit 24B in accordance with the example data storage device 16 shown in FIG. 4.

Third error-related code generating unit 50 may retrieve the data stream stored in media storage unit 24B (138). Notably, the data stream stored in media storage unit 24B includes the transformed data stream but no second error-related code. Third error-related code generating unit 50 may generate a third error-related code (140) and combine the third error-related code with the retrieved data stream.

Acts 144 and 146 of FIG. 11 may be substantially similar to acts 100 and 102 of FIG. 9. Particularly, the retrieved data may travel through data path 42B and error checking unit 44B may determine whether any bits became corrupted in data path 42B. In some examples, error checking unit 44B may transmit an alarm signal to host interface unit 12 indicating that the data became corrupted in the data path 42B. In some examples, error checking unit 44B may correct any corrupted bits.

Third error-related code removing unit 52 may remove the third error-related code (148). Acts 150 through 158 may be substantially similar to acts 106 through 114 of FIG. 9. Particularly, the inverse transformed data stream may be checked for errors by error checking unit 46B, and the errors may be corrected. First error-related code removing unit 30B may remove the first error-related code. After first error-related code removing unit 30B removes the first error-related code, the remaining data stream may include the data the host interface unit 12 desires to read. First error-related code removing unit 30B may transmit the data stream that host interface unit 12 desires to read to host interface unit 12.

Figure 12:
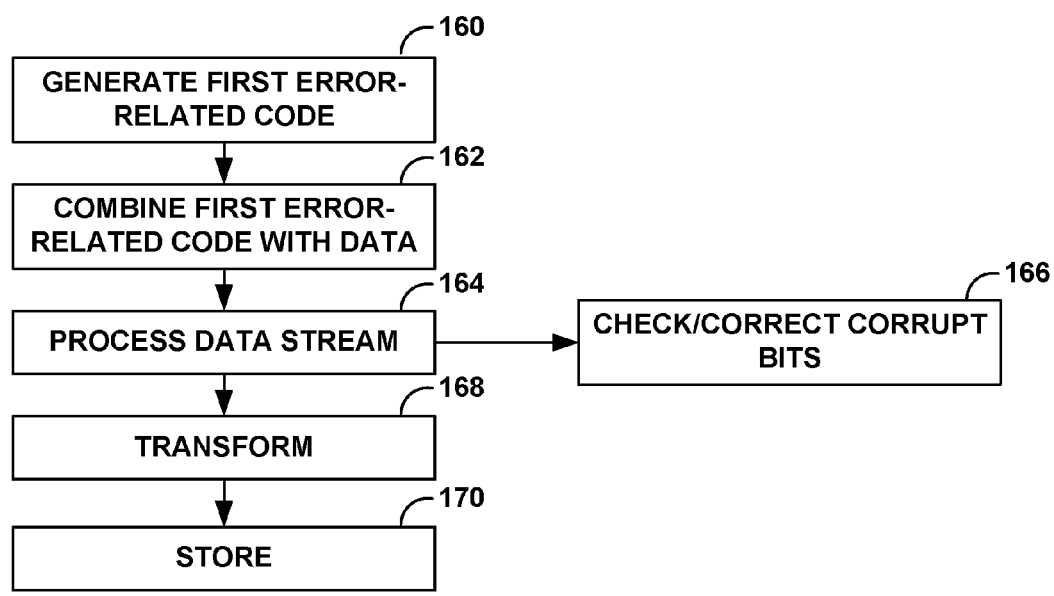
FIG. 12 is a flowchart illustrating an example operation of the example data storage device shown in FIG. 5.

FIG. 12 is a flowchart illustrating an example operation of data storage device 16 shown in FIG. 5. For purposes of clarity and illustration, reference is made to FIG. 5. Data storage device 16 may perform the acts of FIG. 12 when host interface unit 12 writes data to media storage unit 24C in accordance with the example data storage device 16 shown in FIG. 5.

Acts 160 through 168 of FIG. 12 may be substantially similar to acts 76 through 84 of FIG. 8 and require no further elaboration. Media storage unit 24C may store the output of transform unit 20C (170).

Figure 13:
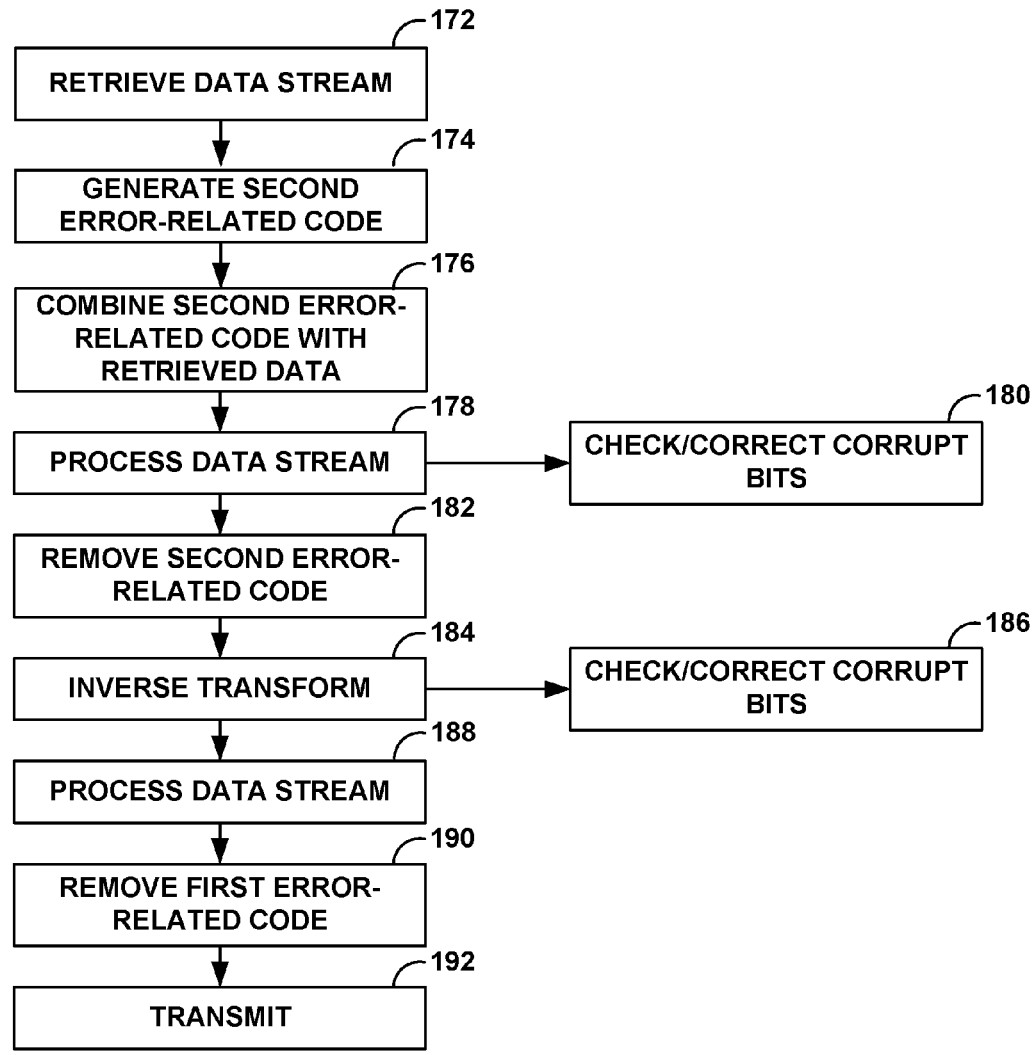
FIG. 13 is a flowchart illustrating another example operation of the example data storage device shown in FIG. 5.

FIG. 13 is a flowchart illustrating another example operation of data storage device 16 shown in FIG. 5. For purposes of clarity and illustration, reference is made to FIG. 5. Data storage device 16 may perform the acts of FIG. 13 when host interface unit 12 reads data from media storage unit 24C in accordance with the examples data storage device 16 shown in FIG. 5.

Second error-related code generating unit 26C may retrieve the data stream from media storage unit 24C (172). The retrieved data stream may include commingled first error-related code and data that host interface unit 12 desires to read. It may difficult to delineate between the first error-related code and the data in the retrieved data stream. Second error-related code generating unit 26C may generate a second error-related code based on the data stream retrieved from media storage unit 24C (174). Second error-related code generating unit 26C may combine the second error-related code with the data stream retrieved from media storage unit 24C (176).

Acts 178 through 192 of FIG. 12 may be substantially similar to acts 100 through 114 of FIG. 9. Accordingly, no additional elaboration is required for acts 178 through 192 of FIG. 13.

The various aspects of this disclosure provide for robust techniques to detect corrupted bits in a data stream. The bits in the data stream may become corrupted through a data storage device when a host interface unit writes to a media storage unit, or the bits may become corrupted through the data storage device when the host interface unit reads from the media storage unit.

The techniques described herein may be implemented in hardware, software, firmware, or any combination thereof. Various features described as modules, units or components may be implemented together in an integrated logic device or separately as discrete but interoperable logic devices or other hardware devices, including optical hardware components. In some cases, various features of electronic circuitry may be implemented as one or more integrated circuit devices, such as an integrated circuit chip or chipset.

If implemented in hardware, this disclosure may be directed to an apparatus such a processor or an integrated circuit device, such as an integrated circuit chip or chipset. Alternatively or additionally, if implemented in software or firmware, the techniques may be realized at least in part by a computer-readable data storage medium comprising instructions that, when executed, cause a processor to perform one or more of the methods described above. For example, the computer-readable data storage medium may store such instructions for execution by a processor.

A computer-readable medium may form part of a computer program product, which may include packaging materials. A computer-readable medium may comprise a computer data storage medium such as read only memory (ROM), RAM, SDRAM, NVRAM, EEPROM, FLASH memory, magnetic or optical data storage media, and the like. The techniques additionally, or alternatively, may be realized at least in part by a computer-readable communication medium that carries or communicates code in the form of instructions or data structures and that can be accessed, read, and/or executed by a computer.

The code or instructions may be software and/or firmware executed by processing circuitry including one or more processors, such as one or more DSPs, general purpose microprocessors, ASICs, FPGAs, ASSPs, or other equivalent integrated or discrete logic circuitry. Accordingly, the term "processor," as used herein may refer to any of the foregoing structure or any other structure suitable for implementation of the techniques described herein. In addition, in some aspects, functionality described in this disclosure may be provided within software modules or hardware modules.

Various aspects have been described in this disclosure. These and other aspects are within the scope of the following claims.

The invention claimed is:

1. A method comprising:
   generating, in a data storage device, a first error-related code based on received data;
   combining, in the data storage device, the first error-related code with the received data to generate a first data stream;
   transforming, in the data storage device, the first data stream into a transformed data stream;
   generating, in the data storage device, a second error-related code based on the transformed data stream;
   combining the second error-related code with the transformed data stream to generate a second data stream;
   processing the second data stream in at least one data path to create a processed data stream, wherein the processed data stream comprises a processed transformed code and processed transformed data;
   generating a third error-related code based on the processed transformed data stream; and
   comparing the third error-related code to the processed transformed code to determine whether the processed data stream is different than the second data stream.

2. The method of claim 1, wherein the received data comprises a first data, the method further comprising:
   transmitting an alarm indication to a host interface unit when the processed data stream is different than the second data stream; and
   receiving a second data that is substantially similar to the first data in response to the alarm indication.

3. The method of claim 1, further comprising:
   removing the second error-related code from the second data stream to generate a third data stream; and
   storing the third data stream.

4. The method of claim 3, further comprising:
   retrieving the third data stream;
   generating a third error-related code based on the third data stream; and
   combining the third error-related code with the third data stream.

5. A method comprising:
   generating, in a data storage device, a first error-related code based on received data
   combining, in the data storage device, the first error-related code with the received data to generate a data stream;
   transforming, in the data storage device, the data stream into a transformed data stream;
   generating, in the data storage device, a second error-related code based on the transformed data stream;
   processing the data stream in at least one data path to create a processed data stream, wherein the processed data stream comprises a processed first error-related code and processed received data;
   generating a third error-related code based on the processed received data; and comparing the third error-related code to the processed first error-related code to determine whether the processed data stream is different than the data stream.

6. The method of claim 1, wherein the first error-related code and the second error-related code each comprise at least one of an error detection code (EDC) and an error correction code (ECC), and wherein transforming the first data stream comprises at least one of encrypting the data stream and compressing the first data stream.

7. The method of claim 1, wherein an algorithm to generate the first error-related code is different than an algorithm to generate the second error-related code.

8. The method of claim 1, further comprising:
storing the second data stream;
retrieving the second data stream;
generating the third error-related code based on a portion of the retrieved second data stream, wherein the portion of the retrieved second data stream comprises the retrieved second data stream without the second error-related code;
processing the retrieved second data stream in at least one data path to create a processed second data stream, wherein the processed second data stream comprises a processed second error-related code and processed transformed data stream;
generating a fourth error-related code based on the processed transformed data stream;
comparing the fourth error-related code to the processed second error-related code to determine whether the processed second data stream is different than the retrieved second data stream; and
removing the processed second error-related code from the processed second data stream to generate a third data stream comprising the processed second data stream without the processed second error-related code.

9. The method of claim 8, further comprising:
inverse transforming the third data stream to generate a fourth data stream, wherein the fourth data stream comprises an inverse transformed code and an inverse transformed data stream;
generating a fifth error-related code based on the inverse transformed data stream;
comparing the fifth error-related code to the inverse transformed code to determine whether the fourth data stream is different than the first data stream;
processing the fourth data stream in at least one data path to create a processed fourth data stream, wherein the processed fourth data stream comprises a processed first error-related code and processed first data stream;
generating a sixth error-related code based on the processed first data stream;
comparing the sixth error-related code to the processed first error-related code to determine whether the processed first data stream is different than the first data stream;
removing the processed first error-related code from the processed fourth data stream to generate a fifth data stream, wherein the fifth data stream is substantially similar to the first data stream; and
transmitting the fifth data stream.

10. A data storage device comprising:
at least one processor;
a first error-related code generating unit configured in the at least one processor to generate a first error-related code based on received data and combine the first error-related code and the received data to generate a first data stream;

a transform unit configured in the at least one processor to transform the first data stream to a transformed data stream;
a second error-related code generating unit configured in the at least one processor to generate a second error-related code based on the transformed data stream and combine the second error-related code with the transformed data stream to generate a second data stream;
a data path configured to process the second data stream and create a processed data stream, wherein the processed data stream comprises a processed transformed code and processed transformed data; and
an error checking unit configured to generate a third error-related code based on the processed data stream and compare the third error-related code to the processed transformed code to determine whether the processed data stream is different than the second data stream.

11. The data storage device of claim 10, wherein the received data comprises first data, wherein the error checking unit transmits an alarm condition to a host interface unit when the processed data stream is different than the second data stream, wherein the data storage device receives second data in response to the alarm condition, and wherein the second data is substantially similar to the first data.

12. The data storage device of claim 10, further comprising:
a second error-related code removing unit configured to remove the second error-related code from the second data stream to generate a third data stream; and
a media storage unit configured to store the third data stream.

13. The data storage device of claim 12, further comprising:
a third error-related code generating unit configured to retrieve the third data stream, generate a third error-related code based on the third data stream, and combine the third error-related code with the third data stream.

14. A data storage device comprising:
at least one processor;
a first error-related code generating unit configured in the at least one processor to generate a first error-related code based on received data and combine the first error-related code and the received data to generate a first data stream;
a transform unit configured in the at least one processor to transform the first data stream to a transformed data stream; and
a second error-related code generating unit configured in the at least one processor to generate a second error-related code based on the transformed data stream;
a data path configured to process the data stream to create a processed data stream, wherein the processed data stream comprises a processed first code and processed received data; and
an error checking unit configured to generate a third error-related code based on the processed received data and compare the third error-related code to the processed first error-related code to determine whether the processed data stream is different than the data stream.

15. The data storage device of claim 10, wherein the first error-related code and the second error-related code each comprise at least one of an error detection code (EDC) and an error correction code (ECC), and wherein the transform unit comprises at least one of an encryption unit and a compression unit.

16. The data storage device of claim 10, wherein an algorithm utilized by the first error-related code generating unit to generate the first error-related code is different than an algorithm utilized by the second error-related code generating unit to generate the second error-related code.

17. The data storage device of claim 10, further comprising:
   a media storage unit configured to store the second data stream;
   a first error checking unit configured to retrieve the second data stream, generate the third error-related code based on a portion of the retrieved second data stream, wherein the portion of the retrieved second data stream comprises the retrieved second data stream without the second code, and compares the third error-related code to the second error-related code to determine whether the retrieved second data stream is different than the stored second data stream;
   a data path configured to process the retrieved second data stream and create a processed second data stream, wherein the processed second data stream comprises a processed second related code and a processed transformed data stream;
   a second error checking unit configured to generate a fourth error-related code based on the processed transformed data stream and compare the fourth error-related code to the processed second error-related code to determine whether the processed second data stream is different than the retrieved second data stream; and
   a second error-related code removing unit configured to remove the second error-related code form the processed second data stream to generate a third data stream comprising the processed second data stream without the processed second error-related code.

18. The data storage device of claim 17, wherein the data path comprises a first data path, and wherein the data storage device further comprises:
   an inverse transform unit configured to inverse transform the third data stream to generate a fourth data stream, wherein the fourth data stream comprises an inverse transformed code and an inverse transformed data stream;
   a third error checking unit configured to generate a fifth error-related code based on the inverse transformed data stream and compare the fifth error-related code to the inverse transformed code to determine whether the fourth data stream is different than the first data stream;
   a second data path configured to process the fourth data stream and create a processed fourth data stream, wherein the processed fourth data stream comprises a processed first code and a processed first data stream;
   a fourth error checking unit configured to generate a sixth code based on the processed first data stream and compare the sixth code to the processed first code to determine whether the processed first data stream is different than the first data stream; and
   a first error-related code removing unit configured to remove the processed first code from the processed fourth data stream to generate a fifth data stream and transmit the fifth data stream, wherein the fifth data stream is substantially similar to the first data stream.

* * * * *